United States Patent
Cheng et al.

(10) Patent No.: US 10,163,966 B2
(45) Date of Patent: Dec. 25, 2018

(54) IMAGE SENSING DEVICE AND MANUFACTURING METHOD THEREOF

(71) Applicant: TAIWAN SEMICONDUCTOR MANUFACTURING COMPANY LTD., Hsinchu (TW)

(72) Inventors: Yun-Wei Cheng, Taipei (TW);
Tsung-Han Tsai, Miaoli County (TW);
Chun-Hao Chou, Tainan (TW);
Kuo-Cheng Lee, Tainan (TW); Volume Chien, Tainan (TW); Yung-Lung Hsu, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/554,649

(22) Filed: Nov. 26, 2014

(65) Prior Publication Data
US 2016/0148970 A1  May 26, 2016

(51) Int. Cl.
*H01L 27/146* (2006.01)

(52) U.S. Cl.
CPC .... *H01L 27/14645* (2013.01); *H01L 27/1463* (2013.01); *H01L 27/1464* (2013.01); *H01L 27/14612* (2013.01); *H01L 27/14621* (2013.01); *H01L 27/14685* (2013.01); *H01L 27/14689* (2013.01)

(58) Field of Classification Search
CPC .................................. H01L 27/146–27/14893
See application file for complete search history.

(56) References Cited

U.S. PATENT DOCUMENTS

| | | | | |
|---|---|---|---|---|
| 2005/0233493 A1* | 10/2005 | Augusto | ................ | G02B 1/005 438/51 |
| 2008/0308893 A1* | 12/2008 | Kirby | ................ | H01L 27/14625 257/459 |
| 2010/0178018 A1* | 7/2010 | Augusto | .................. | G02B 6/12 385/131 |
| 2012/0273906 A1* | 11/2012 | Mackey | ........... | H01L 27/14605 257/432 |
| 2013/0119236 A1* | 5/2013 | Lenchenkov | ..... | H01L 27/14643 250/208.1 |
| 2014/0217486 A1* | 8/2014 | Akiyama | .......... | H01L 27/14632 257/294 |
| 2014/0239431 A1* | 8/2014 | Miyashita | ......... | H01L 27/14621 257/432 |
| 2015/0035109 A1* | 2/2015 | Kataoka | ........... | H01L 27/14634 257/443 |

* cited by examiner

*Primary Examiner* — Brigitte A Paterson
(74) *Attorney, Agent, or Firm* — WPAT, P.C., Intellectual Property Attorneys; Anthony King

(57) ABSTRACT

Some embodiments of the present disclosure provide a method of manufacturing a back side illuminated (BSI) image sensor. The method includes receiving a semiconductive substrate; forming a photosensitive element at a front side of the semiconductive substrate; forming a transistor coupled to the photosensitive element; forming a recess at a back side of the semiconductive substrate; forming a first dielectric layer lining to a side portion of the recess and over the back side of the semiconductor substrate; covering a conductive material over the first dielectric layer and filling in the recess; forming a conductive column on top of the recess by patterning the conductive material; and forming a second dielectric layer covering the conductive column and the first dielectric layer.

20 Claims, 30 Drawing Sheets

IMAGE SENSING DEVICE AND MANUFACTURING METHOD THEREOF

FIELD

The present disclosure relates to a method of manufacturing a back side illuminated (BSI) image sensor.

BACKGROUND

Image sensors are widely used in various imaging applications and products, such as cameras, scanners, photocopiers, etc. A performance of an image sensor is depended on, among other things, its quantum efficiency and optical crosstalk.

The quantum efficiency of an image sensor indicates a number of electrons generated per number of incident photons in the image sensor. The optical crosstalk occurs when some photons incident upon a pixel are absorbed by another pixel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
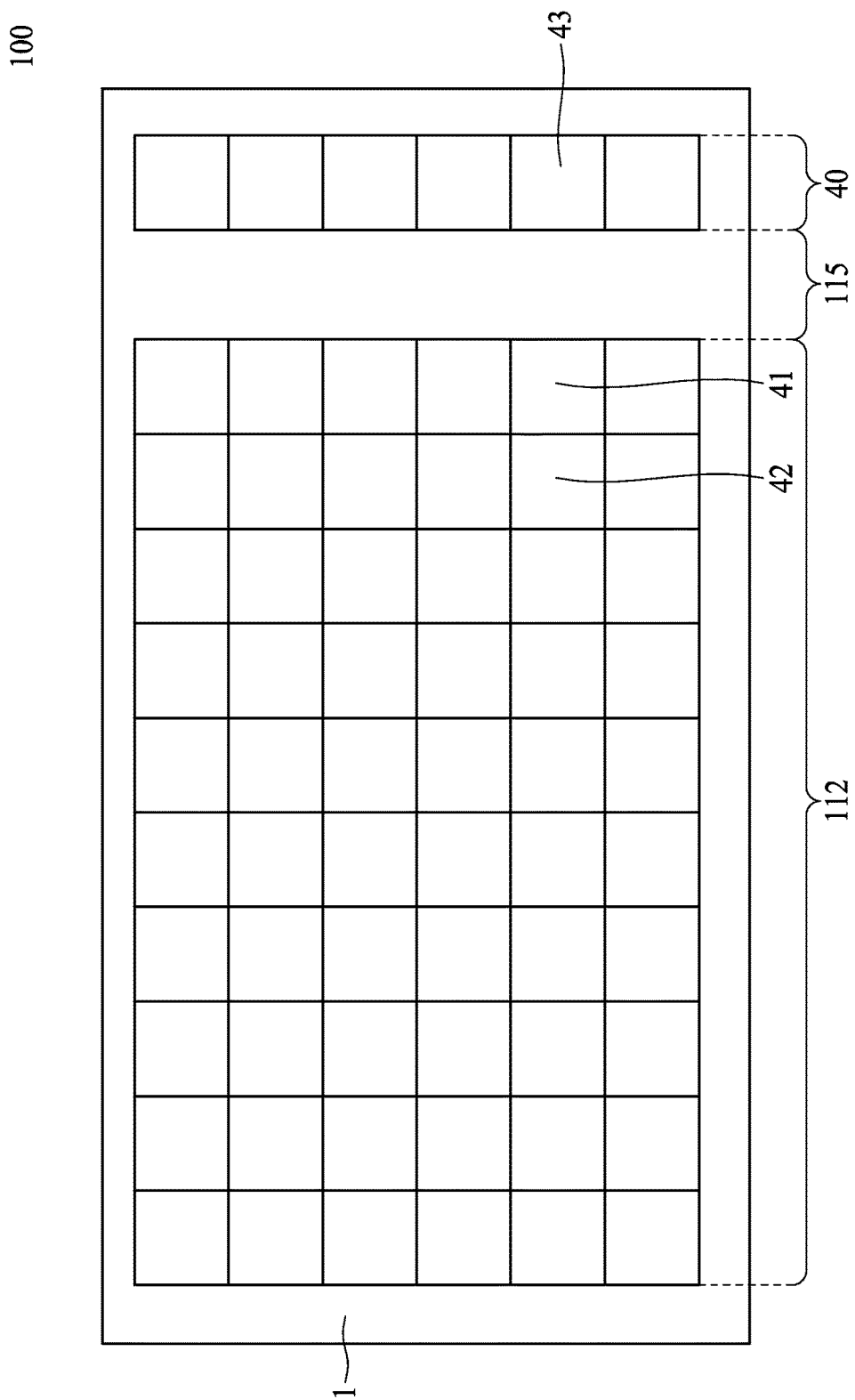
FIG. 1 is a plan view of an image sensor with some pixels, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In FIG. 1, an image sensor 100 is illustrated. The image sensor 100 includes a pixel region 112, a buffer region 115, and a black level control (BLC) region 40. In some embodiments, a logic region (not shown) is outside the pixel region 112 and is under the pixel region 112 and the BLC region 40. The pixel region 112 includes one or more pixels 41 and 42 arranged therein in an active pixel array. The pixels 41 and 42 are configured to convert light to image data. In some embodiments, the pixels 41 and 42 are complementary metal-oxide-semiconductor (CMOS) pixels, and the image sensor 100 is a CMOS image sensor (CIS). In some other embodiments, the pixels 41 and 42 are charged coupled device (CCD) image sensors.

The image sensor 100 includes a semiconductive substrate 1, a plurality of pixels 41, 42 and 43. In some embodiments, the pixels 41 and 42 are monochromatic pixels. In some embodiments, the pixels 41 and 42 are color pixels arranged to detect different wavelengths (colors) from an incident light. In some embodiments, blue (B), green (G), red (R) pixels are used. For example, the pixel 41 is a red pixel and the pixel 42 is a blue pixel. Other color arrangements are usable in further embodiments. Pixel 43 is a black level reference pixel.

Figure 2:
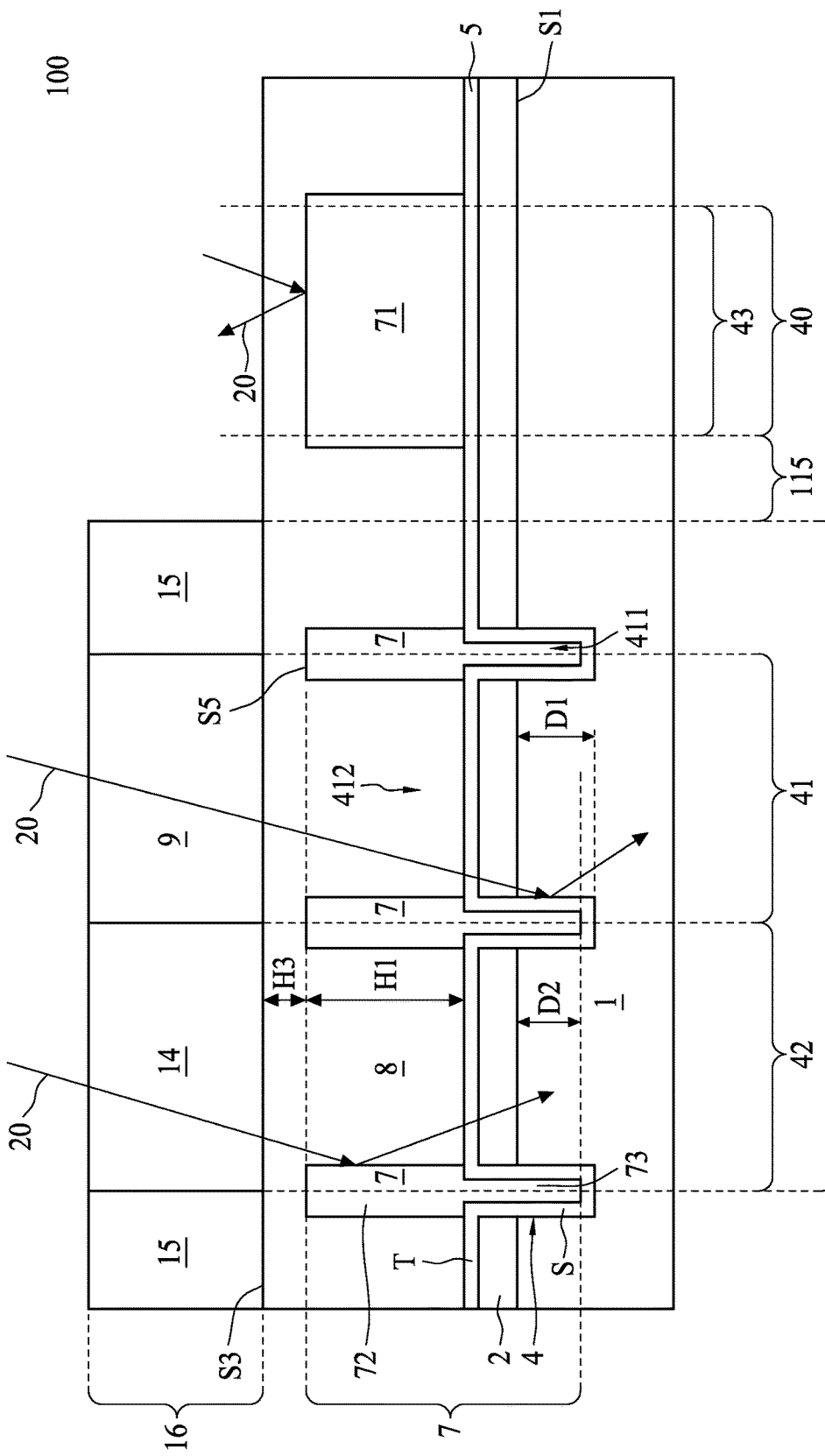
FIG. 2 is a cross-sectional view of an image sensor with some pixels, in accordance with some embodiments of the present disclosure.

FIG. 2 is a cross sectional view of a back side illuminated BSI image sensor 100. The pixel 43 is similar to the pixels 41 and 42, except that a light shield 71 is provided to prevent the pixels 43 from receiving light 20. Thus, image data outputted by the pixels 43 provides a black level that is referenced to calibrate the image sensor 100 and/or to modify image data outputted by the pixels 41 and 42. In some embodiments, the pixels 43 are omitted. A pixel region 112 includes pixels 42 and 41 of different colors. A buffer region 115 is separating pixel region 112 from a black level control (BLC) region 40 by a distance.

The BSI image sensor 100 includes a semiconductive substrate 1, a buffer layer 2, a first dielectric layer 5, a conductive column 7, a second dielectric layer 8, a color filter 9, a color filter 14, and a color filter 15.

In an embodiment, the semiconductive substrate 1 is made from silicon. The semiconductive substrate 1 includes, but is not limited to, bulk silicon, a semiconductor wafer, a silicon-on-insulator (SOI) substrate, or a silicon germanium substrate. Other semiconductor materials including group III, group IV, and group V elements are used in some embodiments. The semiconductive substrate 1 is undoped in some embodiments. In further embodiments, the semiconductive substrate 1 is doped with a p-type dopant or an n-type dopant. A surface S1 is at a top of semiconductive substrate 1. The surface S1 is a back side of the semiconductive substrate 1.

In some embodiments, a buffer layer 2 is overlying on surface S1 of semiconductive substrate 1. The buffer layer 2 is a dielectric layer formed from silicon dioxide (SiO2) or other suitable materials. In some other embodiments, the buffer layer 2 is a passivation layer and is formed from silicon nitride (SiN) or other suitable materials. In an embodiment, the buffer layer 2 is formed from a suitable oxide such as, for example, a plasma enhanced oxide (PEOx).

A recess 4 is penetrating through buffer layer 2 and into semiconductive substrate 1. The recess 4 in the semiconductive substrate 1 includes a depth D1 from surface S1 to a bottom of the recess 4. In some embodiments, the recess 4 is a deep trench isolation (DTI). The recess 4 includes approximately a rectangular shape, trapezoidal shape, elongated elliptical shape, or other suitable shape. Recess 4 is an isolation feature defining and isolating various elements or regions from each other. For example, the recess 4 isolates adjacent pixel 41 and 42 from each other.

A first dielectric layer 5 is covered conformally over the recess 4 and also over the surface S1 of the semiconductive substrate 1. The first dielectric layer 5 is following a contour of the recess 4 such that a recess 411 is over the recess 4. A depth D2 of the recess 4 is from the surface S1 to a bottom of the recess 4. In some embodiments, the first dielectric layer 5 is on top of the buffer layer 2. In some other embodiments, the first dielectric layer 5 is on top of the surface S1 of the semiconductive substrate 1. The first dielectric layer 5 includes a top portion T and a side portion S. The side portion S is lining to a sidewall of the recess 4. The top portion T is overlying horizontally on top of the surface S1 of the semiconductive substrate 1 and between the recesses 4.

The first dielectric layer 5 is made of a dielectric material, silicon dioxide SiO2, nitric oxide NO, silicon oxide SiO, a high density plasma (HDP) oxide, a spin on dielectric (SOD), or other suitable material. The first dielectric layer 5 is a liner made of a dielectric. The first dielectric layer 5 can insulate the conductive column 7 from another conductive column 7.

Conductive column 7 is filled inside the recess 4. Conductive column 7 includes an under portion 73 below the top portion T of the first dielectric layer 5, and an upper portion 72 above the top portion T of the first dielectric layer 5. The upper portion 72 is above the recesses 4 and 411. The under portion 73 is in the recesses 4 and 411. In some embodiments, the upper portion 72 of the conductive column 7 includes a height H1 that is substantially the same with the height H1 of a nearby upper portion 72 of the conductive column 7. Conductive column 7 serves as an isolation to separate pixels 41 and 42 such that light would keep within each individual pixel. In some embodiments, the upper portion 72 of the conductive column 7 is connected with the under portion 73 of the conductive substrate 7 such that material in upper portion 72 is substantially the same as material in under portion 73.

In some other embodiments, the upper portion 72 of the conductive column 7 is disconnected with the under portion 73 of the conductive substrate 7 such that an interface (not shown) is between the under portion 73 and the second dielectric layer 8. In some embodiments, the upper portion 72 of the conductive column 7 is aligned vertically with the under portion 73 of the conductive substrate 7. In some other embodiments, the upper portion 72 of the conductive column 7 is misaligned vertically with the under portion 73 of the conductive column 7 such that the upper portion 73 is offset horizontally relative to the recess 4 and the under portion 72.

A portion of the conductive column 7 (73) is disposed above the buffer layer 2 within the pixel region 112. In an embodiment, the conductive column 7 is formed from a metal such as, for example, tungsten, aluminum, copper, an alloy or composite. In another embodiment, the conductive column 7 is formed from a low refractive index material such as, for example, an oxide. The conductive columns 7 have walls that project above the semiconductive substrate 1 and form a cavity 412.

A second dielectric layer 8 covers the conductive column 7 and the first dielectric layer 5. A second dielectric layer 8 blanket covers upper portion 72 of the conductive column 7 and light shield 71. The second dielectric layer 8 is disposed in the pixel region 112, over a portion of the first dielectric layer 5 in the buffer region 115, and over the light shield 71 occupying the BLC region 40.

Some color filters 15, 14, and 9 are different colors disposed above the second dielectric layer 8 within each respective pixel. For example, color filter 15 is a green filter, color filter 14 is a blue filter, and color filter 9 is a red filter. The color filter 9 is in the pixel 41, which is a red pixel. A plurality of color filters 15, 14, and 9 forms a color filter array 16. In some embodiments, the color filter array 16 is a Bayer pattern color filter array (BCFA).

In an embodiment, one of the color filters 9 and 14 is vertically aligned with one of the pixels 41 and 42 respectively in the pixel region 112 of the image sensor 100. In an embodiment, the color filters 15, 14, and 9 are each formed from a suitable polymer material, polymeric, or resin with colored pigments.

The light shield 71 is disposed over the first dielectric layer 5 within the BLC region 40. In an embodiment, the light shield 71 is made from a similar material as the conductive column 7. The light shield 71 is made from a metal such as, for example, tungsten, aluminum, copper, an alloy or composite. In an embodiment, the light shield 71 is formed from a low refractive index material such as, for example, an oxide.

In FIG. 2, a light 20 passes through the color filter 14 and into the second dielectric layer 8. The color filter array 16 includes material with a second refractive index. The second dielectric layer 8 includes a third refractive index. The third refractive index is higher than the second refractive index such that light 20 traveling from color filter array 16 to second dielectric layer 8 is kept within second dielectric layer 8. The light 20 reaches the second dielectric layer 8 and is reflected off of the upper portion 72 of the conductive column 7 to stay within the pixel 42.

The light 20 travels from the second dielectric layer 8 to the first dielectric layer 5. The second dielectric layer 8 has a third refractive index. The first dielectric layer 5 has a fourth refractive index. The third refractive index is lower than the fourth refractive index to keep the light 20 traveling in a direction from the second dielectric layer 8 to the first dielectric layer 5.

The light 20 travels from the first dielectric layer 5 to the buffer layer 2. The buffer layer 2 has a fifth refractive index. The fourth refractive index is lower than the fifth refractive index.

The light 20 travels from the buffer layer 2 to the semiconductive substrate 1. The semiconductive substrate 1 has a sixth refractive index. The fifth refractive index is lower than the sixth refractive index to keep the light 20 staying within the semiconductive substrate 1.

Another light 20 is passing through color filter 9 of a color filter array 16. Color filter 9 is in pixel 41. The light 20 passes through the second dielectric layer 8, the first dielectric layer 5, and the buffer layer 2. The light 20 reaches the semiconductive substrate 1 and is reflected from the under portion 73 of the conductive column 7 to stay within the pixel 41.

Another light 20 is passing through the second dielectric layer 8 at the BLC region 40. The light 20 is reflected off from the light shield 71 and is not reaching an underlying semiconductive substrate 1 in the BLC region 40.

Figure 3:
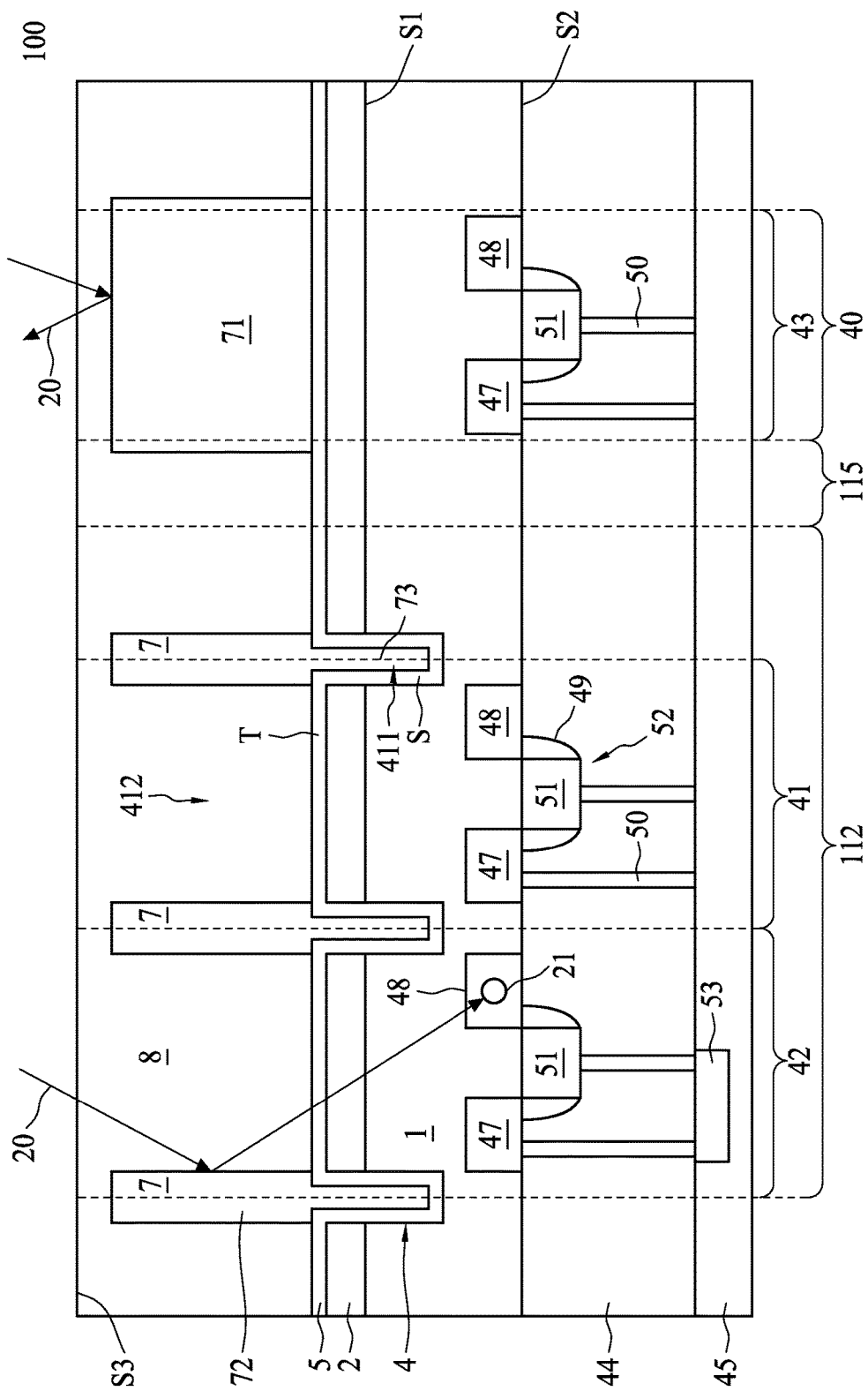
FIG. 3 is a cross-sectional view of an image sensor with some pixels, in accordance with some embodiments.

In FIG. 3, in some embodiments, the image sensor 100 is back side illuminated (BSI). The image sensor 100 includes a photosensitive element 48 coupled to a transistor 52. In the BSI configuration, the transistor 52, the interconnection 53, and the redistribution layer 45 are formed on a front side, surface S2, of the semiconductive substrate 1 and light 20 is allowed to pass through the back side, surface S1, to reach the photosensitive element 48 in the semiconductive substrate 1. As such, the light 20 hits the photosensitive element 48 before reaching the interconnection 53, the redistribution layer 45, a gate structure 51, a gate spacer 49, or the contact 50.

The conductive column 7 functions to prevent cross-talk between the pixels 41 and 42 in the pixel region 112. Cross-talk occurs when light from one pixel 41 makes its way into an adjacent pixel 42, thereby causing the adjacent pixel 42 to sense the light by the transistor 52. Such cross-talk can reduce a precision and a quantum efficiency of the image sensor 100.

In an embodiment, the conductive column 7 is electrically conductive. The conductive column 7 is configured to be biased with a positive or negative bias voltage, depending upon the type of transistor 52. An amount of biasing is adjusted to create an accumulation region around a side portion S of first dielectric layer 5 and around the recesses 411 and 4. In this manner, a charge 21 in pixel 42 is prevented from migrating to some other pixels, such as pixel 41.

In some embodiments, the semiconductive substrate 1 includes some integrated circuits formed therein and/or thereon. The semiconductive substrate 1 contains or supports a plurality of photo-sensitive elements such as, for example, photosensitive element 48. In an embodiment, a photosensitive element 48 is disposed in each pixel 41 or 42 in the pixel region 112 and in each pixel 43 in the BLC region 40. The semiconductive substrate 1 includes a back side S1 opposite to a front side S2. The back side S1 is also referred to as surface S1. The front side S2 is also referred to as surface S2. The photosensitive element 48 is in the semiconductive substrate 1 and lining horizontally to the front side S2. The transistor 52 is coupled to the interconnection 53 in a redistribution layer 45 through a contact 50.

A light 20 is received and converted by the photosensitive element 48 into image data. The photosensitive element 48 is configured to convert light 20 to charges 21. The transistor 52 is coupled to the photosensitive element 48 to transfer the image data to a circuitry in the inter-layer dielectric (ILD) 44 for further processing and/or output. In some embodiments, the photosensitive element 48 is a pinned layer photodiode (not shown) or a photodiode. In some embodiments, the pinned layer photodiode is defined by one or more doped regions at the front side S2 and within the semiconductive substrate 1. The transistor 52 is a transfer transistor for transferring the image data captured by the corresponding photosensitive element 48 to the circuitry.

In some embodiments, additional transistors with various functions are also included in each pixel 41, 42, or 43. For example, a reset transistor, a source follower transistor, and/or a select transistor are included. The principles described herein are also applicable to a CCD pixel in further embodiments.

The transistor 52 includes a gate structure 51, a gate spacer 49 on a side of the gate structure 51, and a source/drain region 47. The source/drain region 47 is formed opposite the photosensitive element 48 across the gate structure 51. In some embodiments, other transistors in each pixel 41, 42, or 43 in the inter-layer dielectric (ILD) 44 are structured similarly to the transistor 52. A redistribution layer 45 is under the inter-layer dielectric (ILD) 44. The redistribution layer 45 includes one or more dielectric layers, such as, boron phosphorous silicate glass (BPSG), plasma enhanced tetra-ethyl-ortho-silicate (PE-TEOS), or any other suitable dielectric materials. A plurality of contacts 50 is formed in the inter-layer dielectric (ILD) 44 to couple with the gate structures 51 and the source/drain regions 47 of the transistors 52. A redistribution layer 45 is under the ILD 44 to couple interconnection 53 to the transistors 52 through the contact 50. The redistribution layer 45 includes alternating conductive and dielectric layers (not shown) which are patterned and/or otherwise processed to form an interconnection 53. The interconnections 53 are coupling to some devices (e.g., the transistors 52) and/or between some underlying devices and external circuitry.

Figure 4:
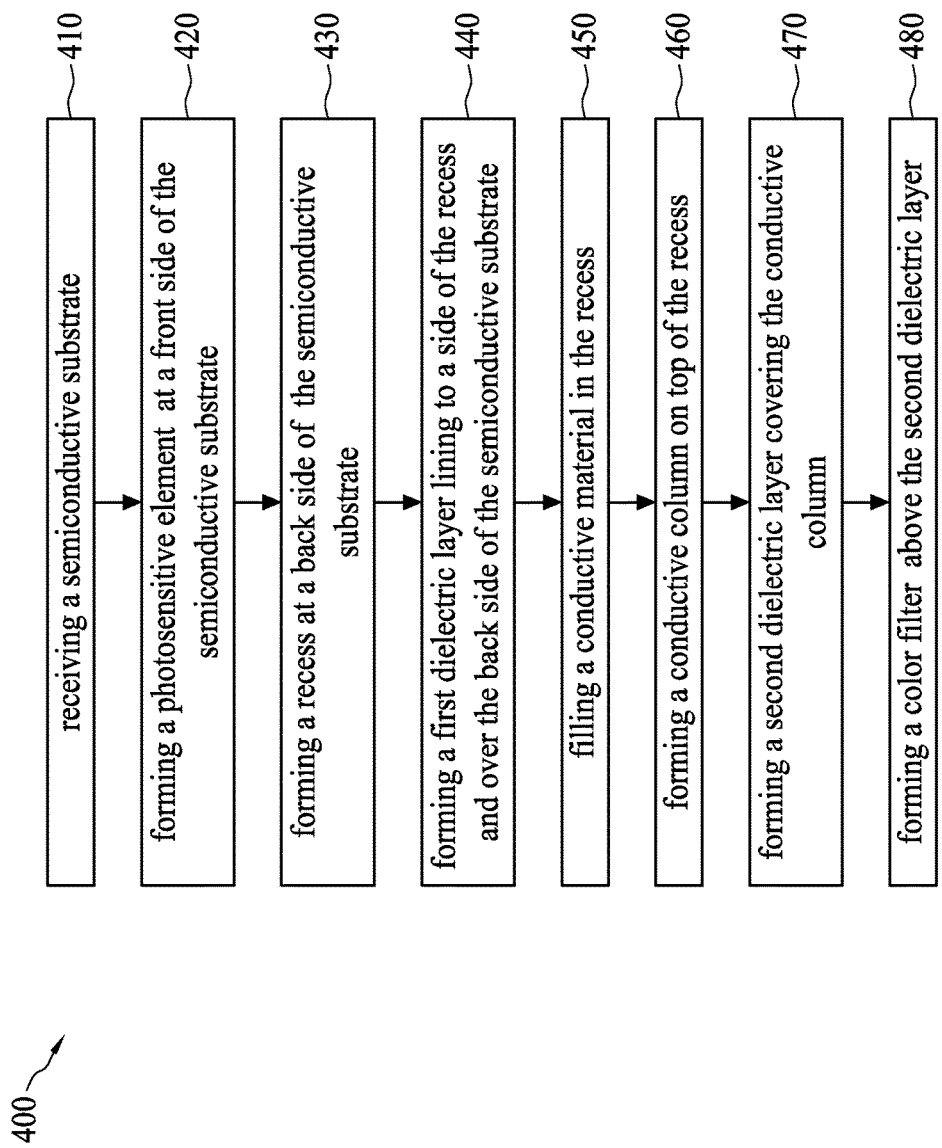
FIG. 4 is an operational flow of a method for manufacturing an image sensor, in accordance with some embodiments.
Figure 5:
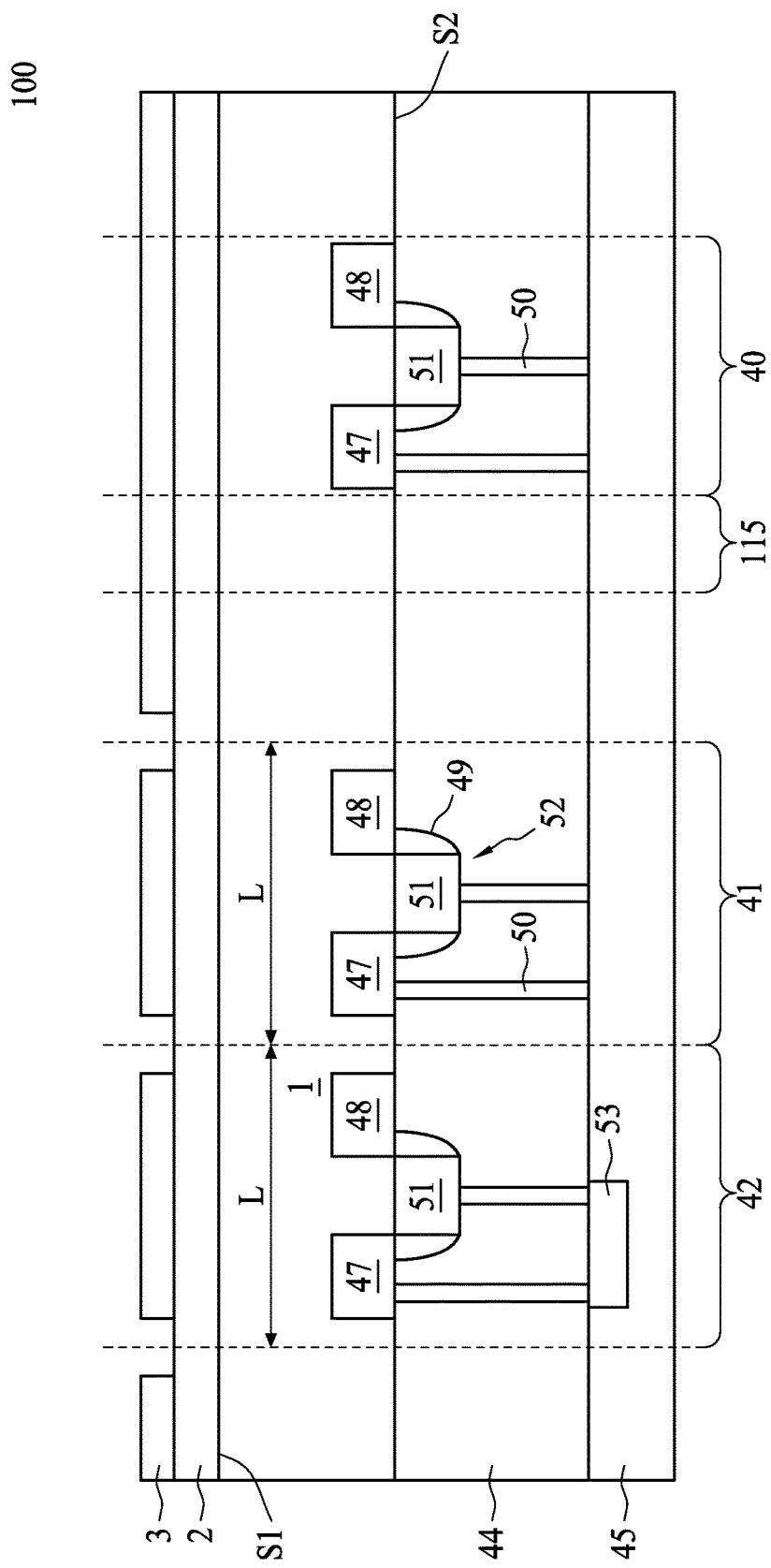
FIGS. 5 to 15 are cross sectional views of an operation in a method for manufacturing an image sensor, in accordance with some embodiments.
Figure 6:
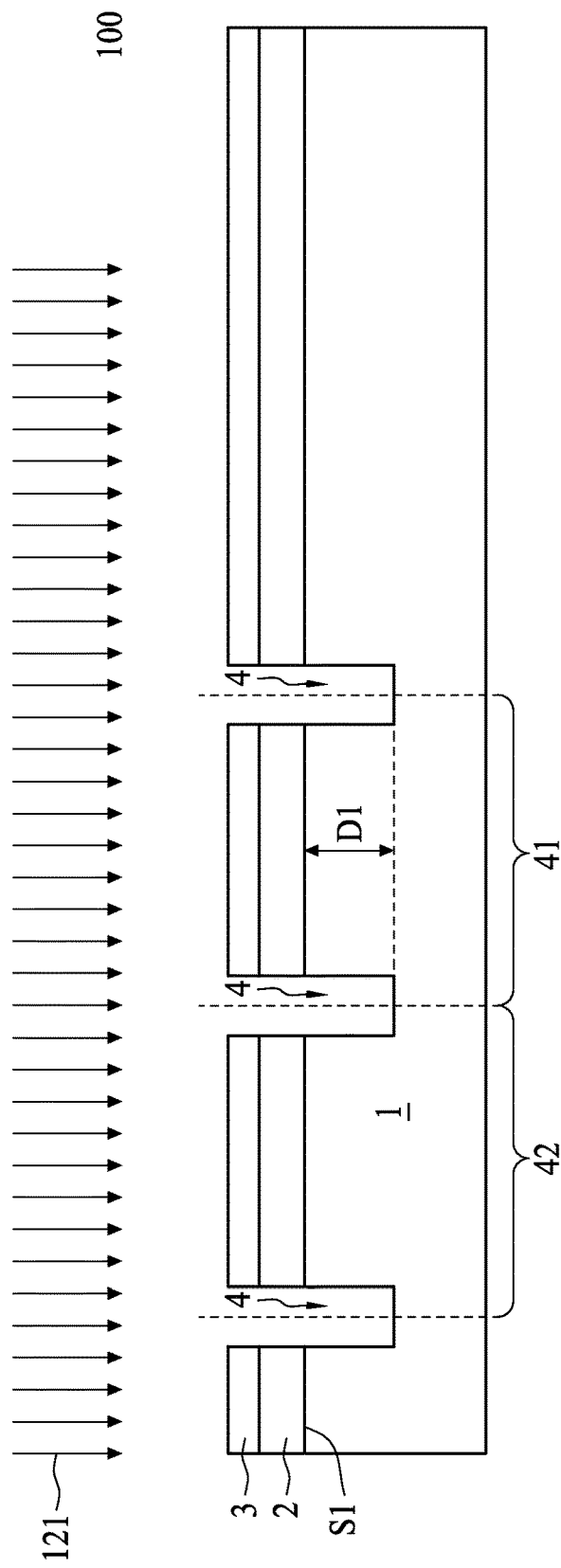
Figure 7:
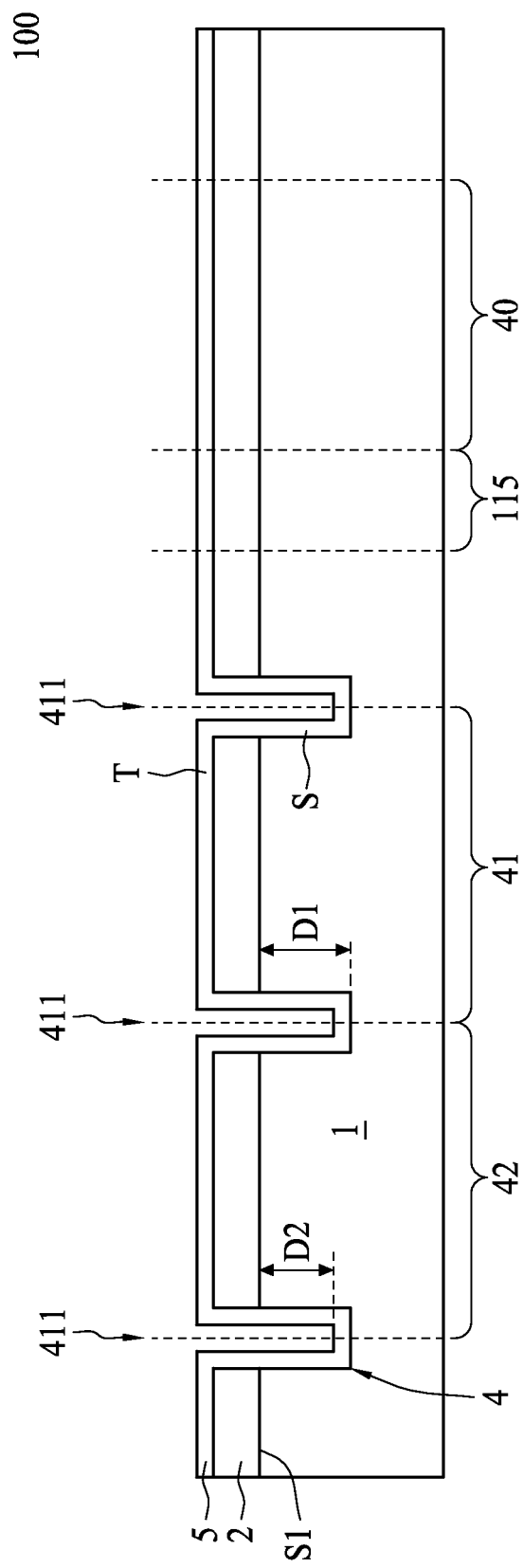
Figure 8:
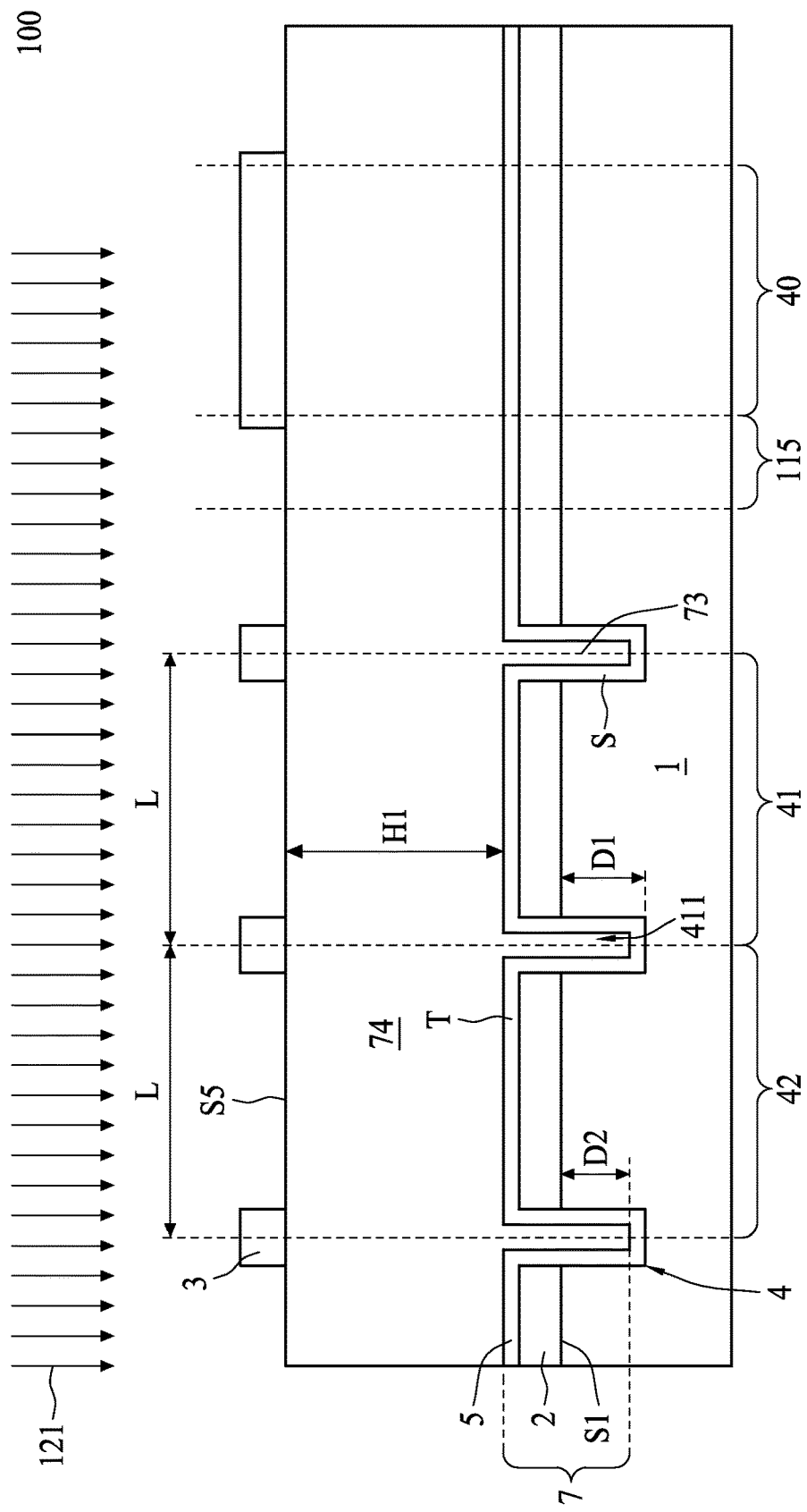
Figure 9:
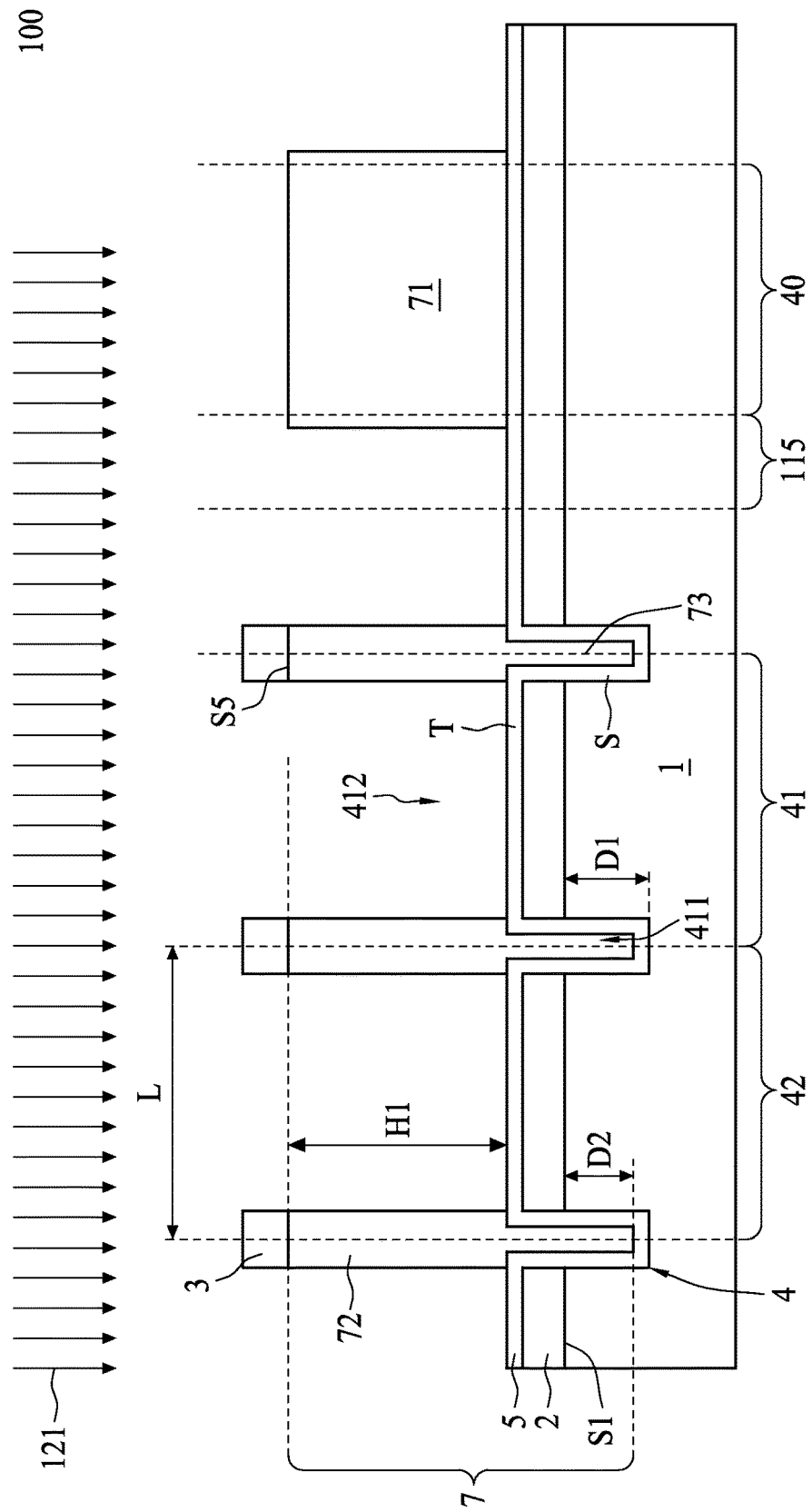
Figure 10:
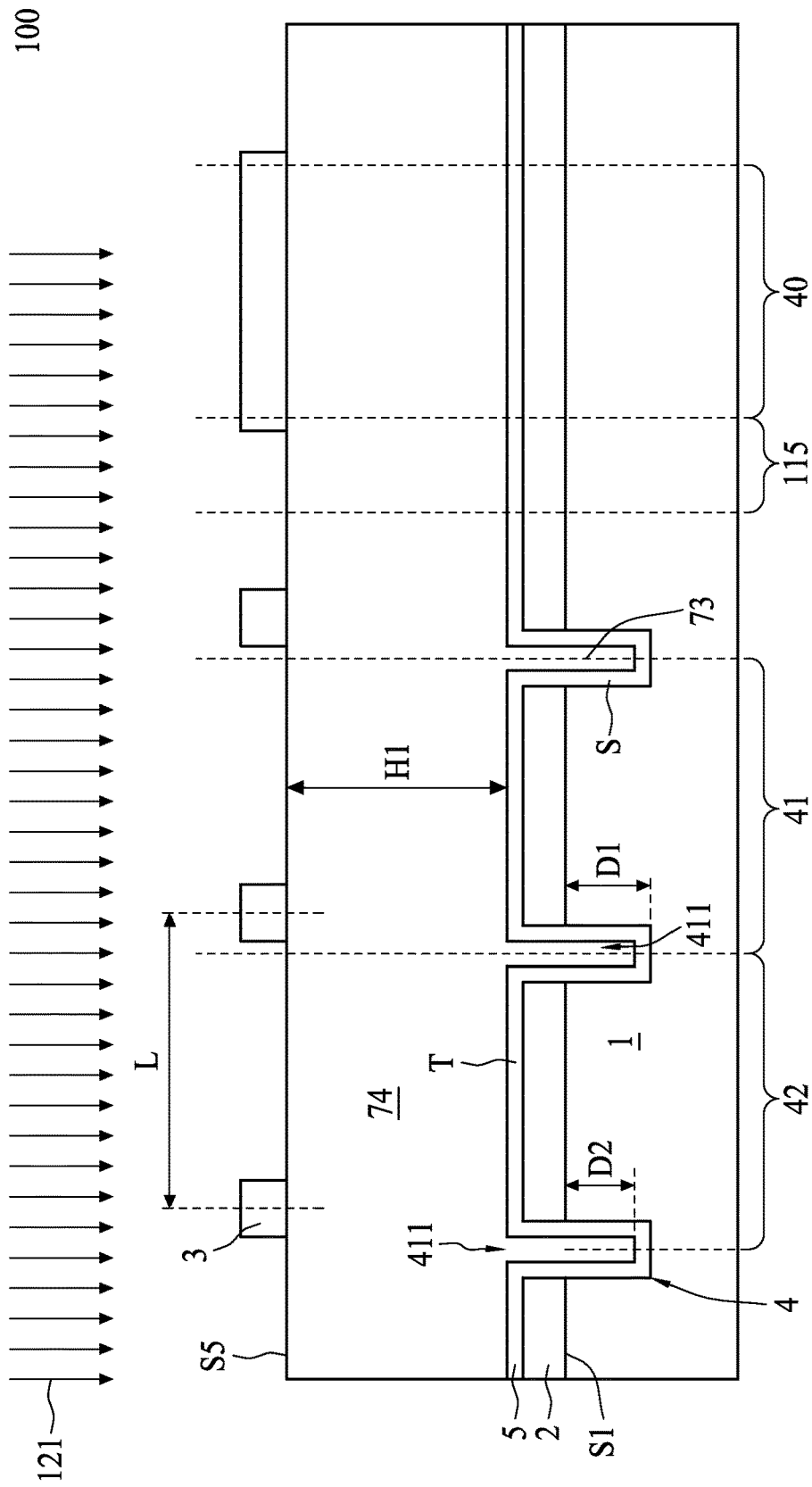
Figure 11:
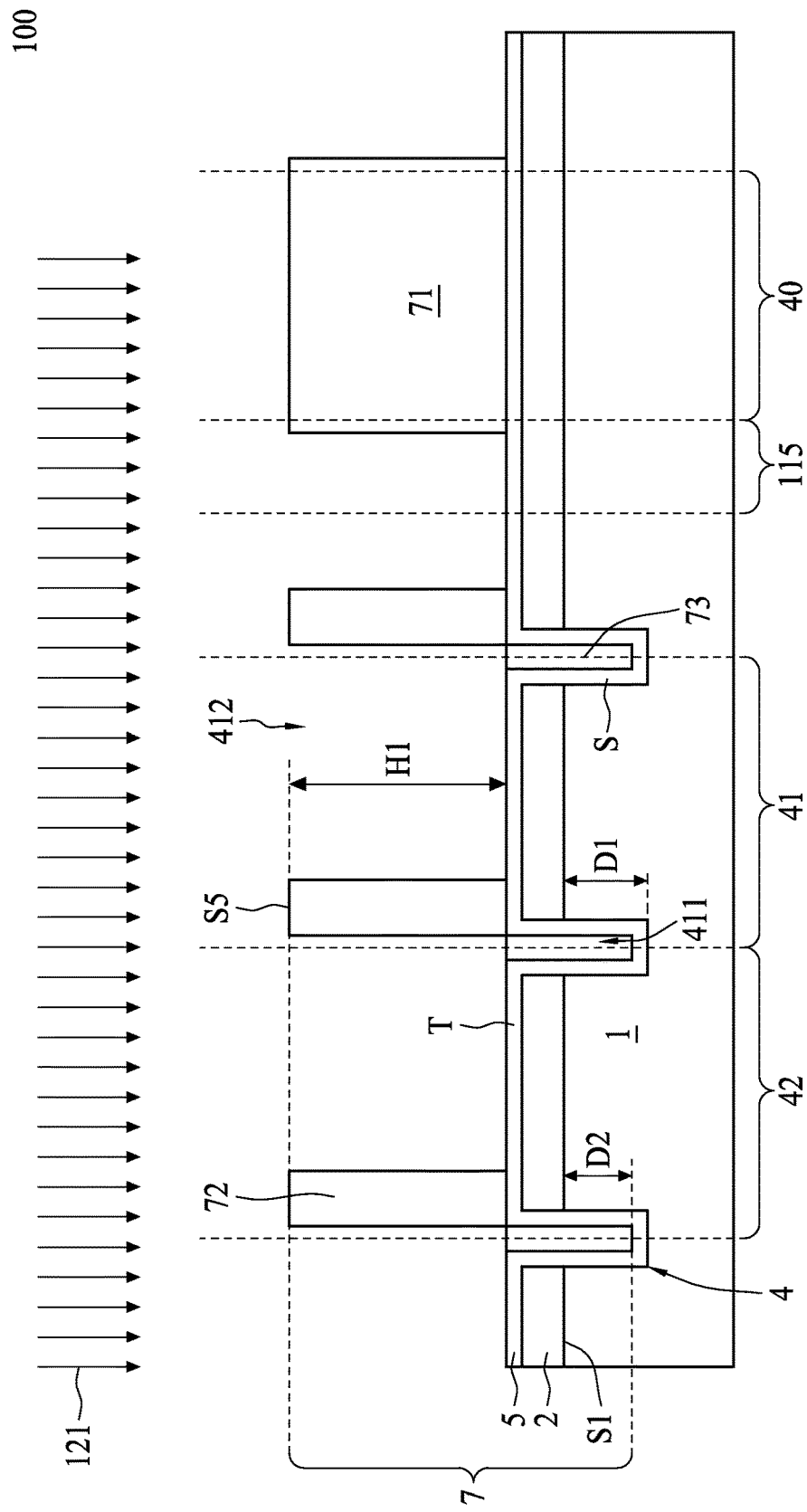
Figure 12:
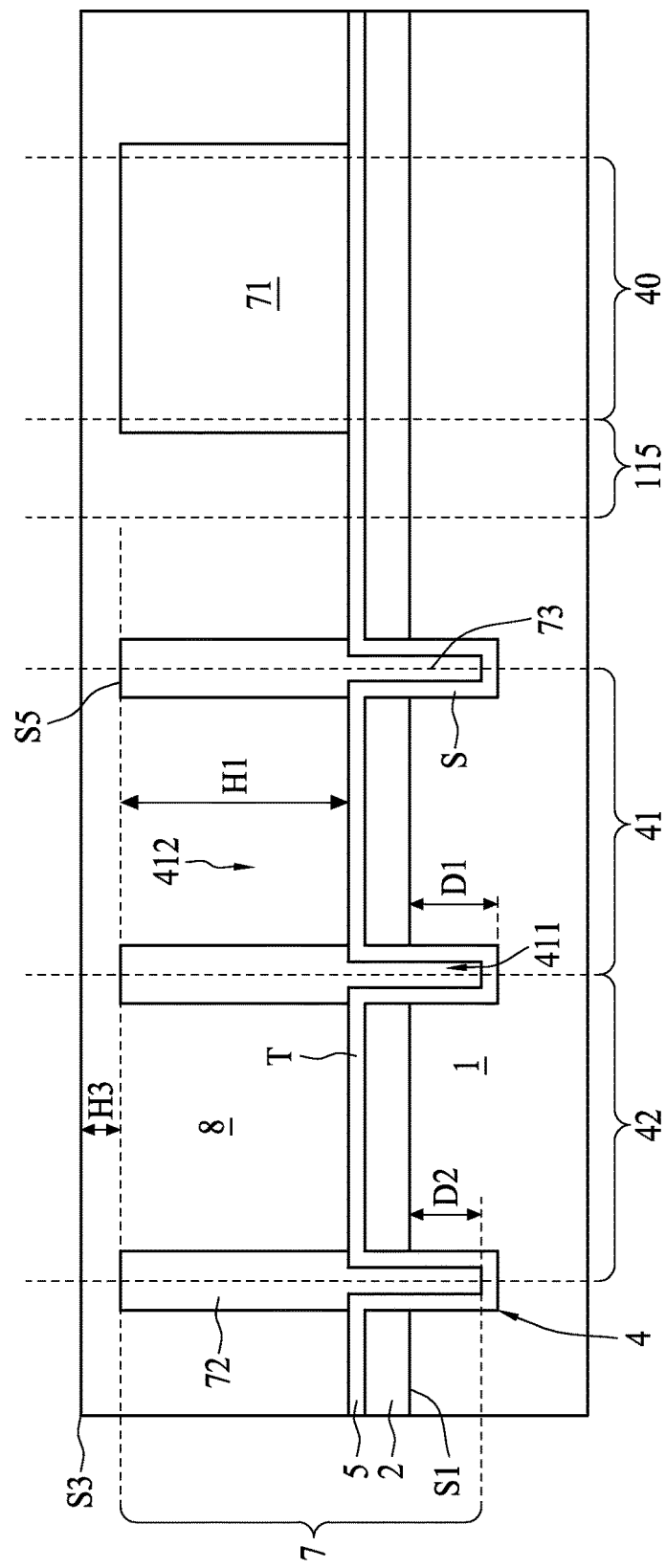
Figure 25:
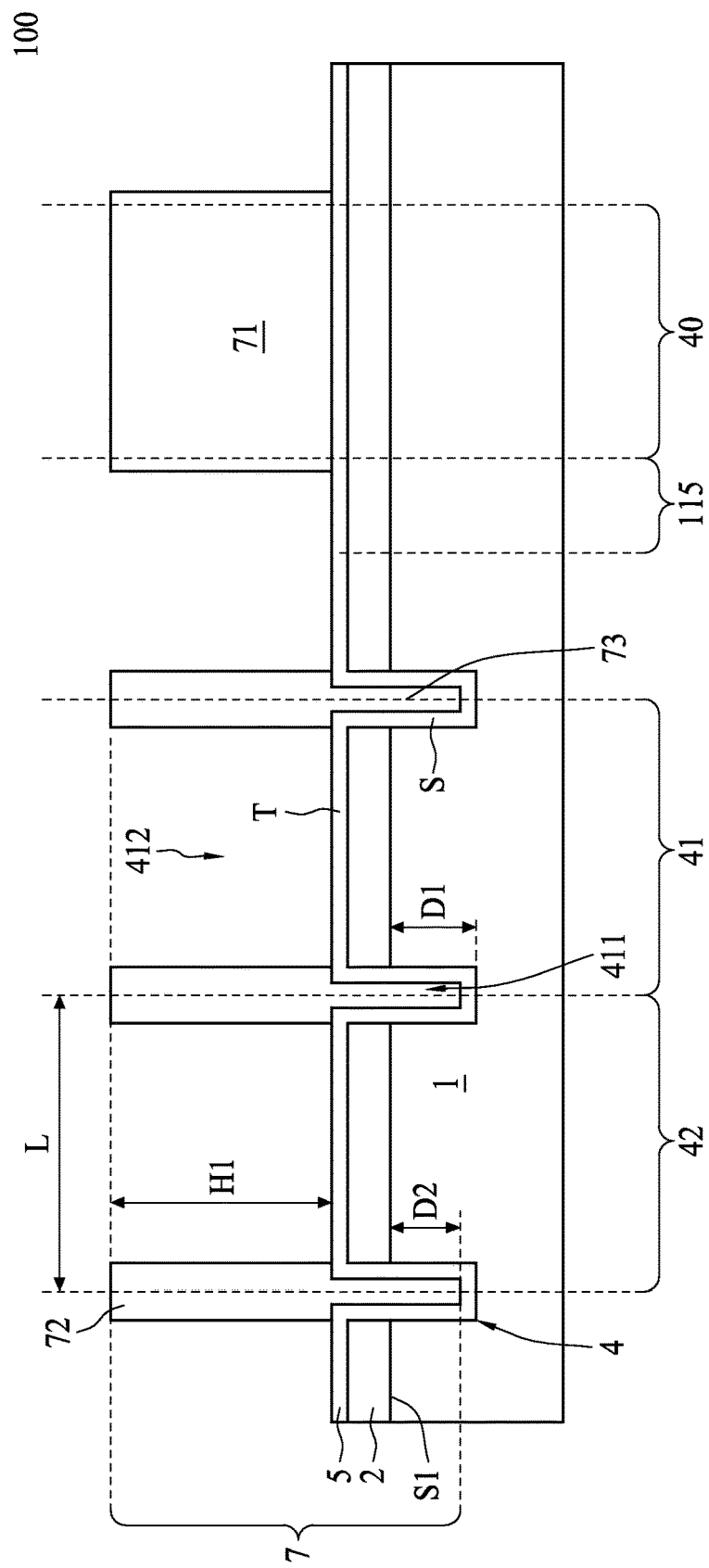
FIGS. 25 to 30 are cross sectional views of an operation in a method for manufacturing an image sensor, in accordance with some embodiments.
Figure 26:
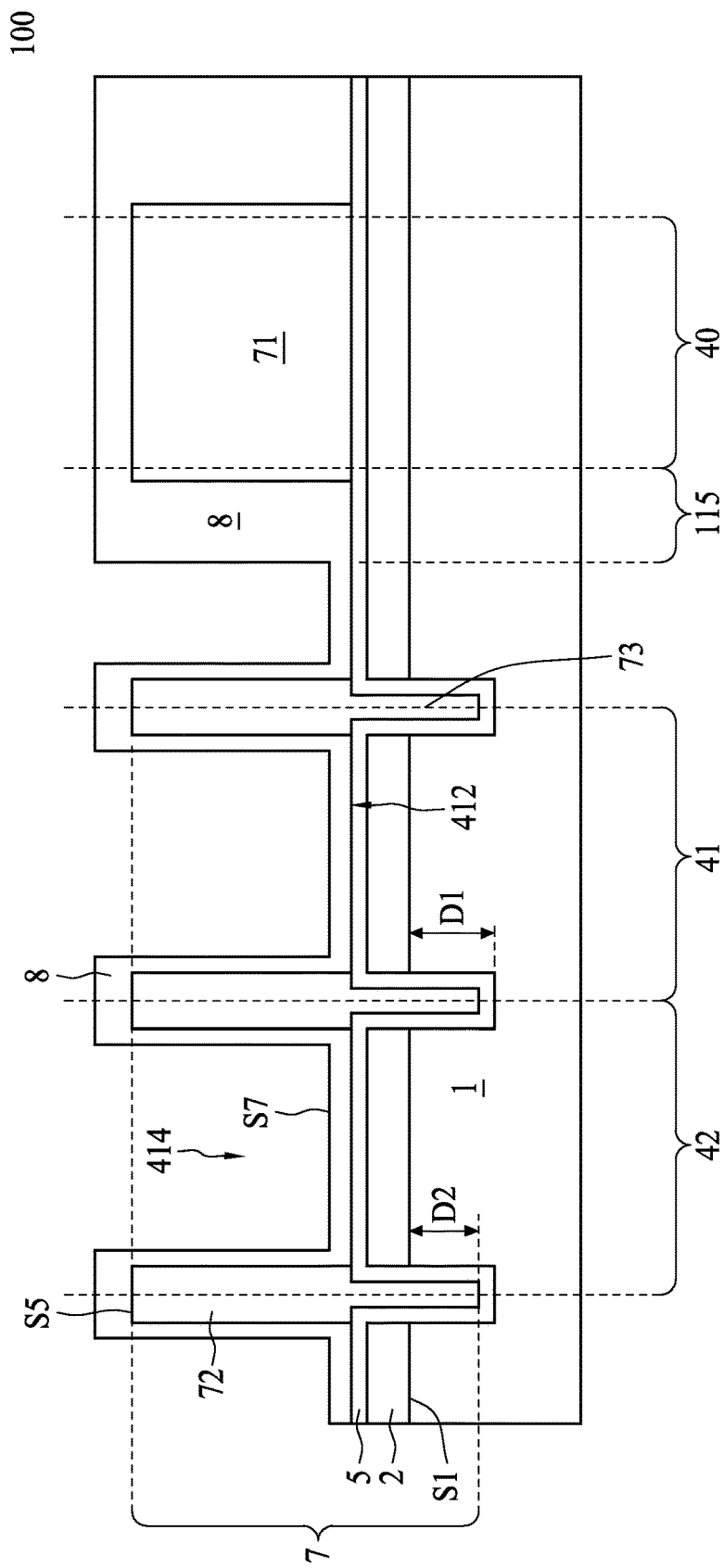

In FIG. 4, a method of manufacturing 400 is illustrated. FIG. 4 illustrates a process flow for forming the image sensor 100 in FIG. 3. Operation 410 receives a semiconductive substrate 1. Some exemplary embodiments for operation 410 are illustrated in FIG. 5. Operation 420 forms a photosensitive element 48 at a front side S2 of the semiconductive substrate 1. Operation 430 forms a recess 4 at a back side S1 of the semiconductive substrate 1. Some exemplary embodiments for operation 430 are illustrated in FIG. 6. Operation 440 forms a first dielectric layer 5 lining to a side of the recess 4 and over the back side S1 of the semiconductive substrate 1. Some exemplary embodiments for operation 440 are illustrated in FIG. 7. Operation 450 fills a conductive material 74 in the recess 411. Some exemplary embodiments for operation 450 are illustrated in FIGS. 8 and 10. Operation 460 forms a conductive column 7 on top of the recess 411. Some exemplary embodiments for operation 460 are illustrated in FIGS. 9 and 11. Operation 470 forms a second dielectric layer 8 covering the conductive column 7. Some exemplary embodiments for operation 470 are illustrated in FIGS. 12, 25, and 26. Operation 480 forms a color filter 9, 14, and 15 above the second dielectric layer 8. Some exemplary embodiments for operation 480 are illustrated in FIGS. 13 to 15, 18 to 21, and 28 to 30.

In FIG. 5, a semiconductive substrate 1 is received. In some embodiments, the semiconductive substrate 1 is received with a photosensitive element 48 formed at a surface S2 of the semiconductive substrate 1. The doped regions are formed by ion implantation processes. The source/drain region 47 includes one doped region formed by, for example, ion-implantation. The redistribution layer 45 is formed by plasma enhanced chemical vapor deposition (PECVD) or low pressure chemical vapor deposition (LPCVD), physical vapor deposition (PVD), etc. The contacts 50 are formed by photolithography, etching, metal deposition, etc. The surface S2 is a front side of the image sensor 100. Surface S1 is above surface S2 for forming the buffer layer 2 on top of surface S1.

A buffer layer 2 is formed over the surface S1 of the semiconductive substrate 1. In some embodiments, the buffer layer 2 is formed before forming the recess 4. The photoresist 3 is formed on top of the buffer layer 2. Photoresist 3 is patterned by any suitable method in a lithography process. The pattern forms some openings. The openings are equal distanced away from each other by a length L. The length L defines a length of each pixel 41 or 42.

In FIG. 6, a recess 4 is formed. The recess 4 is penetrating through the buffer layer 2 and into the semiconductive substrate 1 at a back side S1 of the semiconductive substrate 1. The recess 4 is formed by any suitable process such as a lithography process. The lithography process can be a photolithography process includes forming a photoresist 3 overlying buffer layer 2, exposing photoresist 3 to a pattern, performing a post-exposure bake process, and developing the photoresist 3 to form a masking element including the photoresist 3.

A pattern on the photoresist 3 is transferred by a suitable etching process to buffer layer 2 and semiconductive substrate 1 to form recess 4 at a certain depth D1. Some suitable etching process can include dry etching, wet etching, and/or other etching methods (e.g., reactive ion etching). The etching process 121 can also be purely chemical (plasma etching), purely physical (ion milling), and/or combinations thereof.

In some embodiments, recess 4 has high aspect ratio, which means a small opening at a top and a long recess depth. In some embodiments, the etching process 121 is a dry etching process. The dry etching process can be implemented in an etching chamber. The dry etching process can implement an oxygen-containing gas, fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr, He and/or CHBR3), iodine-containing gas, other suitable gases and/or plasmas, and/or combinations thereof. In some embodiments, the dry etching process utilizes an O2 plasma treatment and/or an O2/N2 plasma treatment. Further, the dry etching process can be performed for a suitable duration. Some process parameters such as etching durations and/or etch rate are adjustable to control the depth D1 of the recess 4.

In FIG. 7, a first dielectric layer 5 is formed with a side portion S lining conformally to a side of the recess 4 and a top portion T over a surface S1 of the semiconductive substrate 1. In some embodiments, the buffer layer 2 is between the first dielectric layer 5 and the surface S1. The first dielectric layer 5 formed conformally over the recess 4 to form another recess 411 over the recess 4.

In an embodiment, a first dielectric layer 5 is a thin film formed by a deposition process. The deposition process can include chemical vapor deposition (CVD), physical vapor deposition (PVD), atomic layer deposition (ALD), high density plasma CVD (HDPCVD), remote plasma CVD (RPCVD), plasma enhanced CVD (PECVD), low-pressure chemical vapor deposition (LPCVD) process, thermal oxidation, UV-ozone oxidation, epitaxial growth methods (e.g., selective epitaxy growth), sputtering, plating, electrolytic plating, electroless plating, spin-on coating, other suitable methods, and/or combinations thereof.

In FIG. 8, a conductive material 74 is covered over the first dielectric layer 5 and filling in the recess 411. The conductive material 74 is filling in the recess 411 to form an under portion 73 in contact with the side portion S of the first dielectric layer 5. The conductive material 74 is covering over the semiconductive substrate 1 with other underlying layers such as the buffer layer 2. The conductive material 74 is in contact with the top portion T of the first passivation layer 5. The conductive material 74 is deposited over semiconductive substrate 1 up to a surface S5. The surface S5 is an upper surface above the top portion T of the first dielectric layer 5 by a height H1.

In an embodiment, conductive material 74 is deposited first by any suitable method of deposition process. In some embodiments, simultaneous deposition and etching may fill the recess 411 with conductive material 74. Some deposition processes may include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure chemical vapor deposition (LPCVD) process, thermal oxidation, UV-ozone oxidation, sputtering, plating, other suitable methods, and/or combinations thereof. A height H1 of conductive material 74 may be controlled by adjusting some process parameters in a CVD process. The process parameters may be a total pressure, some reactant concentrations, a deposition temperature, and a deposition rate.

The conductive material 74 used in the deposition process may be polysilicon, doped (N or P) conductive material containing silicon, undoped polysilicon, silicon-germanium, or an undoped polysilicon that is deposited and then doped.

In FIG. 8, in some embodiments, a photoresist 3 is aligned vertically over the recess 411. The photoresist 3 is patterned and covering some portions of the surface S5 of the conductive material 74. The conductive material 74 is patterned by some suitable processes such as the lithography process. The operation of patterning is using a photoresist 3 overlying on the conductive material 74. A pattern of the photoresist 3 is transferred to the conductive material 74 to form the conductive column 7 by some etching process. In some embodiments, the etching process 121 is etching back the conductive material 74. The operation of etching back lowers an exposed portion of the conductive material 74 by a height H1. The operation of etching back the conductive material 74 exposes the top portion T of the first dielectric layer 5.

A pattern on the photoresist 3 can then be transferred by an etching process 121 to some underlying layers (i.e., conductive material 74) to form cavity 412 in FIG. 9. The photoresist 3 is stripped thereafter. In FIG. 9, a conductive column 7 is formed on top of the recesses 411 and 4 by patterning the conductive material 74 in FIG. 8.

In FIG. 9, an upper portion 72 of the conductive column 7 is aligned with an under portion 73 of the conductive column 7. The upper portion 72 and the under portion 73 are connected and in contact with each other. The length L is between each photoresist 3 to form the conductive columns 7 with the length L between each conductive column 7.

The surface S5 is at a top of upper portion 72. The conductive columns 7 can be formed in an array of conductive columns 7. The array of conductive columns 7 is a metal grid.

In some embodiments, the etching process 121 is a selective etching. The selective etching can use some fluorine-containing gas, HBr and/or Cl2 as etch gases. In some embodiments, a bias voltage used in the etching process 121 can be adjusted to allow better control of an etching direction to be isotropic or anisotropic for forming the cavity 412. In some embodiments, the selective etching includes a faster etching rate for the second dielectric layer 8 than for the first dielectric layer 5. Different etchant can be used for etching different compositions of materials. Alternatively, in some other embodiments, the lithography process is implemented or replaced by a maskless photolithography, electron-beam writing, and ion-beam writing. In another alternative, the lithography process could implement nanoimprint technology.

As an alternative to traditional photolithography, upper portion 72 of the conductive column 7 can be formed by a double-patterning lithography (DPL) process. DPL is a method of constructing a pattern on a substrate by dividing the pattern into two interleaved patterns. Various DPL methodologies include double exposure (e.g., using two mask sets), forming some spacers adjacent features and removing the features to provide a pattern of the spacers, photoresist freezing, and/or other suitable processes. It is understood that under portion 73 can be formed in a similar manner.

In FIG. 10, in some other embodiments, a photoresist 3 is misaligned with the recess 411 or recess 4. A misaligned pattern of the photoresist 3 is covering some portions of the surface S5 of the conductive material 74. The conductive material 74 is patterned by some suitable processes such as a lithography process. The lithography process includes the etching process. In some embodiments, the etching process 121 is etching back the conductive material 74. The operation of etching lowers an exposed portion of the conductive material 74 by a height H1. The operation of etching the conductive material 74 exposes the top portion T of the first dielectric layer 5.

The misaligned pattern on the photoresist 3 can then be transferred by an etching process 121 to some underlying layers (i.e., conductive material 74) to form cavity 412 in FIG. 11. The photoresist 3 is stripped thereafter. In FIG. 11, a conductive column 7 is formed above the recess 411, the recess 4, and the top portion T of the first dielectric layer 5.

In FIG. 11, an upper portion 72 of the conductive column 7 is misaligned vertically with an under portion 73. For example, the upper portion 72 is offset horizontally such that the under portion 73 is exposed. In some embodiments, the shifting is by a distance such that the upper portion 72 and the under portion 73 are not in contact with each other. The upper portion 72 is formed over the back side S1 of the semiconductive substrate 1.

In FIG. 12, a second dielectric layer 8 is formed covering the conductive column 7 and the first dielectric layer 5. The second dielectric layer 8 is filling a cavity 412 between each conductive column 7. The second dielectric layer 8 is deposited thicker than the height H1 of the upper portion 72. The second dielectric layer 8 is covering up to a level above the surface S5 of the conductive column 7. A surface S3 is at a top of the second dielectric layer 8.

The second dielectric layer 8 is formed by a suitable method of deposition process. Some deposition methods may be chemical vapor deposition (CVD), physical vapor deposition (PVD), atomic layer deposition (ALD), high density plasma CVD (HDPCVD), remote plasma CVD (RPCVD), plasma enhanced CVD (PECVD), and low-pressure chemical vapor deposition (LPCVD) process.

In some embodiments, a planarization is performed to lower the second dielectric layer 8. The surface S3 of the second dielectric layer 8 is over the surface S5 of the upper portion 72 of the conductive column 7 by a height H3. The planarization is performed by any suitable process.

In some embodiments, a HDPCVD process is used to fill cavity 412 by using a simultaneous deposition and etching action. In some embodiment, a conductive material 8 may be blanket-deposited (CVD) into cavity 412. Subsequently, a dry plasma etch back may remove some excess blanket layers to lower the second dielectric layer 8. In some embodiments, a planarization, such as CMP, may also be used to remove the excess blanket layers to reduce the height H3.

Figure 13:
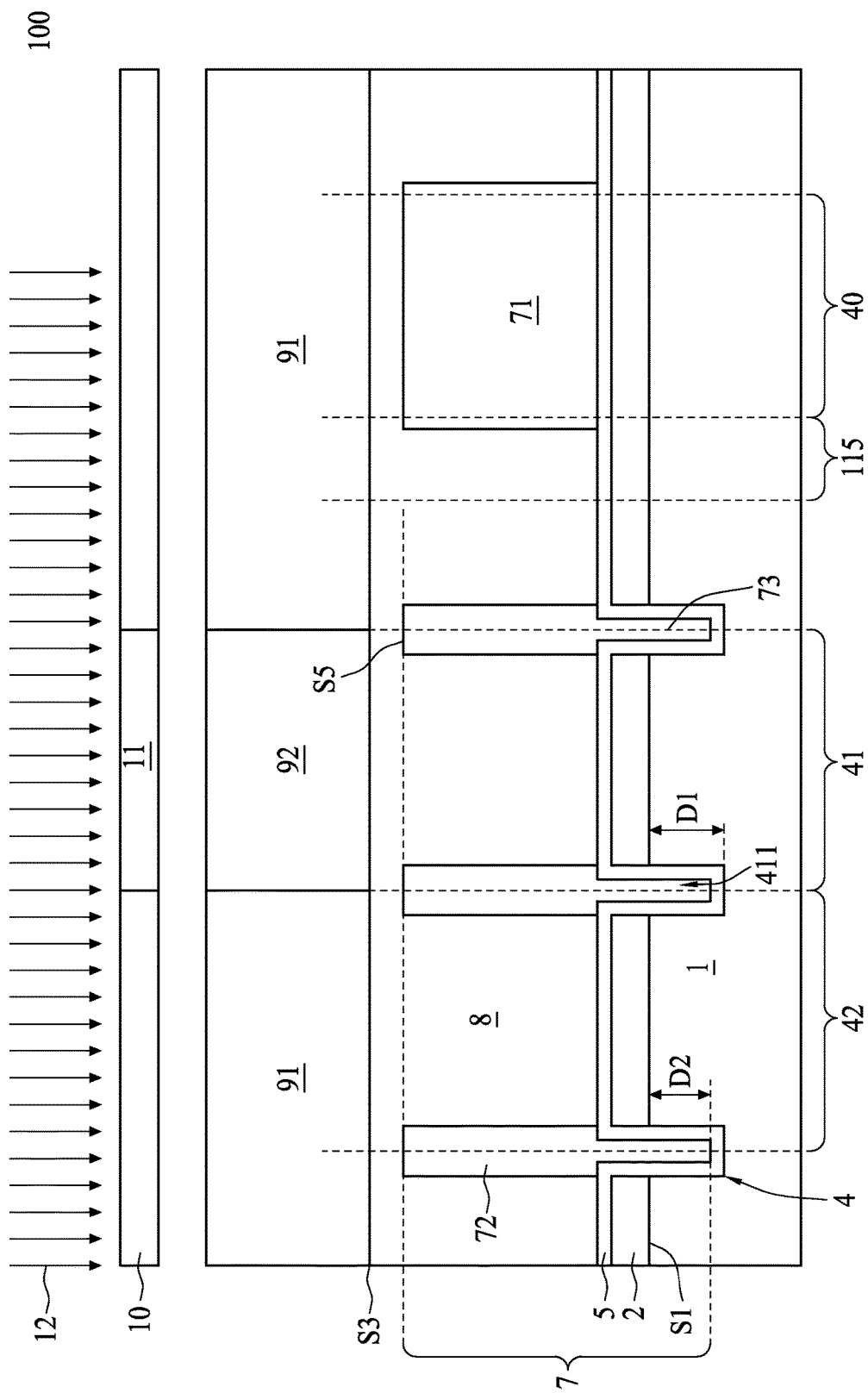

In FIG. 13, a color resist 91 is formed over the second dielectric layer 8, on top of the surface S3. The color resist 91 is for allowing a light with a color red, green, or blue to pass through. For example, the color resist 91 is a red color resist, which filters a red light to pass through the color resist 91.

The color resist 91 is formed by any suitable process such as a deposition process. The deposition process may be spin-on coating, chemical vapor deposition (CVD), physical vapor deposition (PVD), atomic layer deposition (ALD), high density plasma CVD (HDPCVD), remote plasma CVD (RPCVD), plasma enhanced CVD (PECVD), and low-pressure chemical vapor deposition (LPCVD) process.

A suitable process such as photolithography is performed on the color resist 91. In photolithography the color resist 91 is exposed through a photomask 10. A photomask 10 is patterned to include a region 11. The region 11 forms a pattern on top of each pixel 41 or 42. The pattern corresponds to a pattern of a color filter array 16 in FIG. 2. The conductive column 7 serves to define the boundary for each pixel 41 or 42 of different color. The photomask 10 is placed over the color resist 91 to allow ultraviolet (UV) light 12 reaching to a portion 92 of the color resist 91 under the region 11. The color resist 91 is photosensitive. The portion 92 of the color resist 91 under the region 11 is exposed to UV light 12. To make the pattern insoluble, the portion 92 of the color resist 91 under the region 11 is UV cured by exposure through a photomask 10. Other soluble portions of the color resist 91 is removed by a developing solution, the pattern is cured through baking. The portion 92 is hardened, insoluble and remained on top of the second dielectric layer 8.

Figure 14:
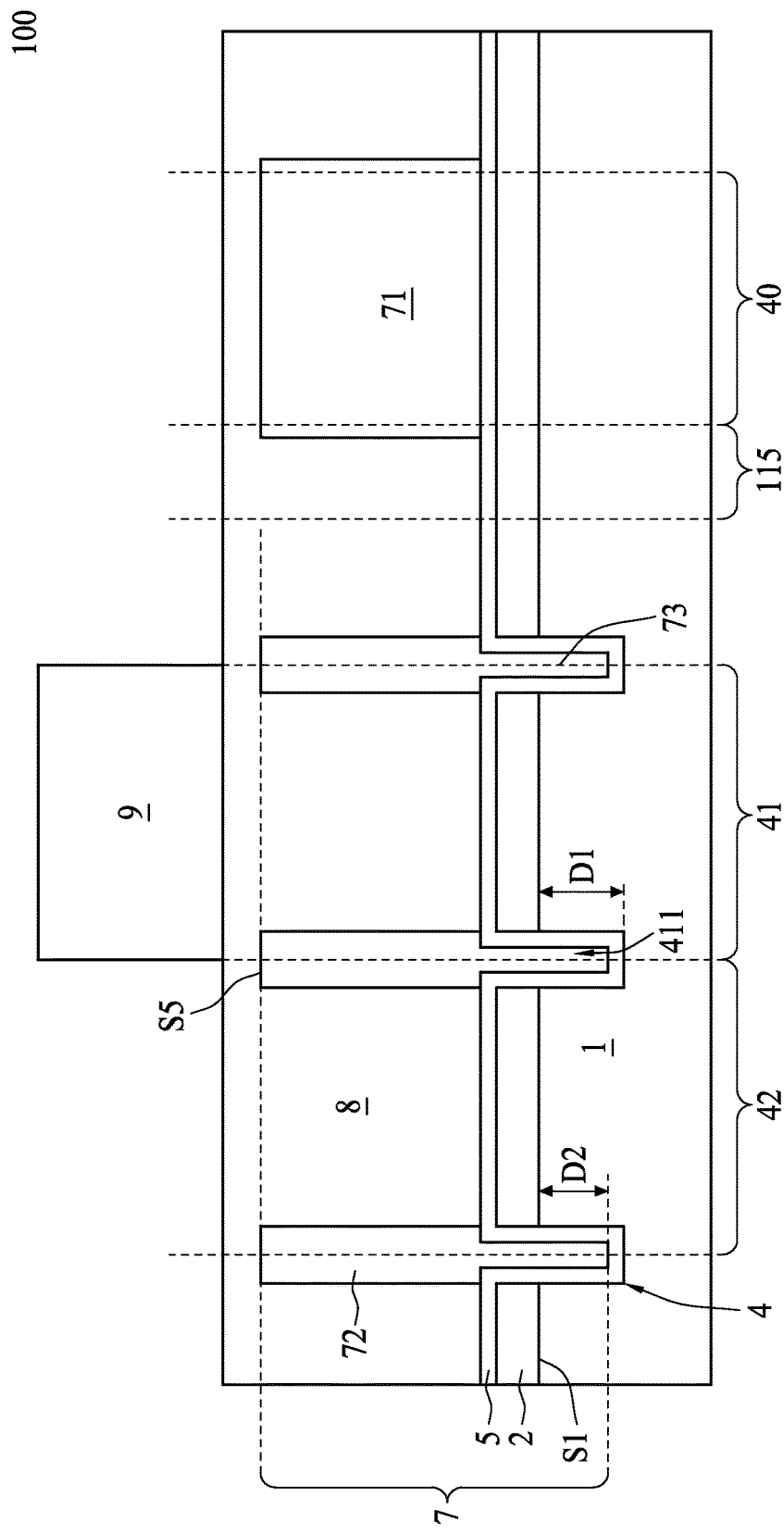

In FIG. 14, the portion remained is a color filter 9. The operation of forming the color filter 9 is illustrated from FIG. 13 to FIG. 14. The color filter 9 is aligned within the pixel 41 between the conductive columns 7.

Figure 15:
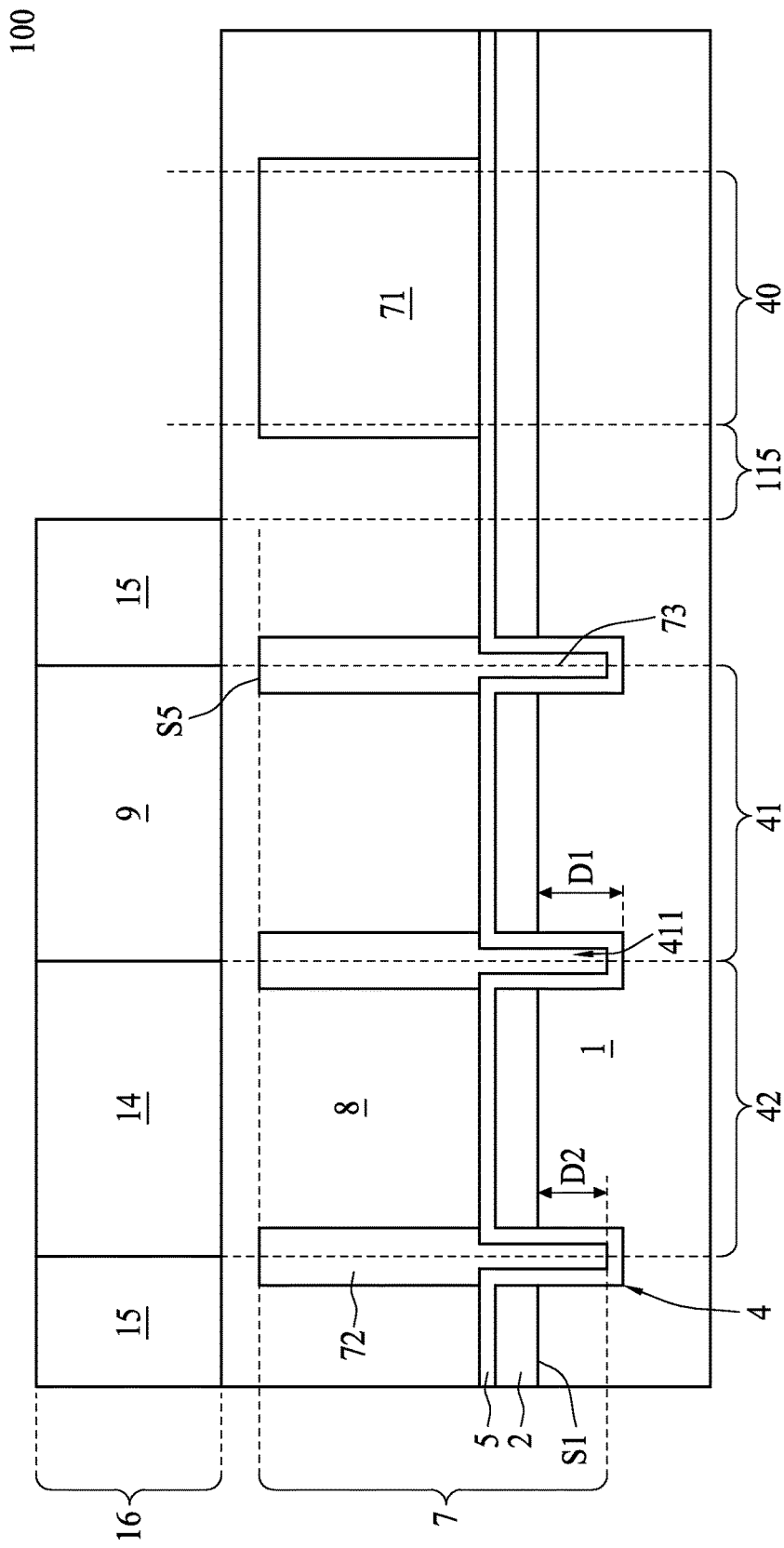

In FIG. 15, a color filter 14 and a color filter 15 are formed sequentially by a similar operation as the operation for forming the color filter 9, except that a different color resist is used and patterned to dispose at a different pixel. The color filter 14 is disposed within pixel 42 adjacent to the color filter 9. The color filter 15 is formed adjacent to the color filter 14.

In some embodiments, the color filter array 16 is formed by some suitable method such as pigment diffusion method using color resist, pigment diffusion method using etching, dyeing method, or combination thereof.

Figure 16:
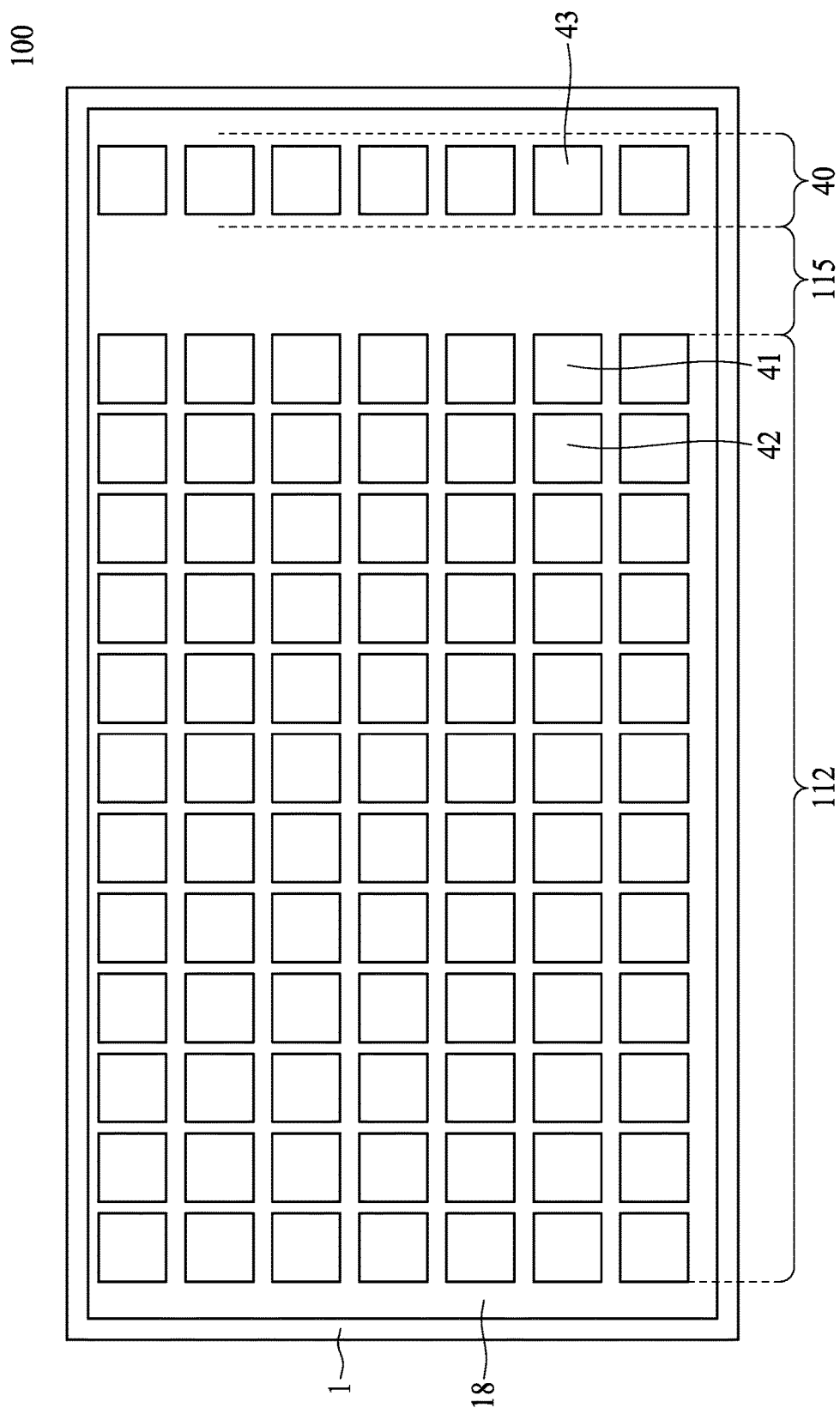
FIG. 16 is a plan view of an image sensor with some pixels, in accordance with some embodiments of the present disclosure.

In FIG. 16, in some embodiments, an image sensor 100 with a barrier 18 is illustrated. The image sensor 100 includes a semiconductive substrate 1, a plurality of pixels 42, 41, and 43. The barrier 18 is in between each pixel 42, 41, 43 and separating each pixel 42, 41, 43. The barrier 18 is also surrounding each pixel 42, 41 in the pixel region 112. The barrier 18 includes a first refractive index that is lower than a second refractive index of the color filter array 16. The first refractive index is lower than a refractive index of each color filter 9, 14, 15. The barrier 18 is in the buffer region 115 and extends over to the pixel 43, which is a black level reference pixel.

Figure 17:
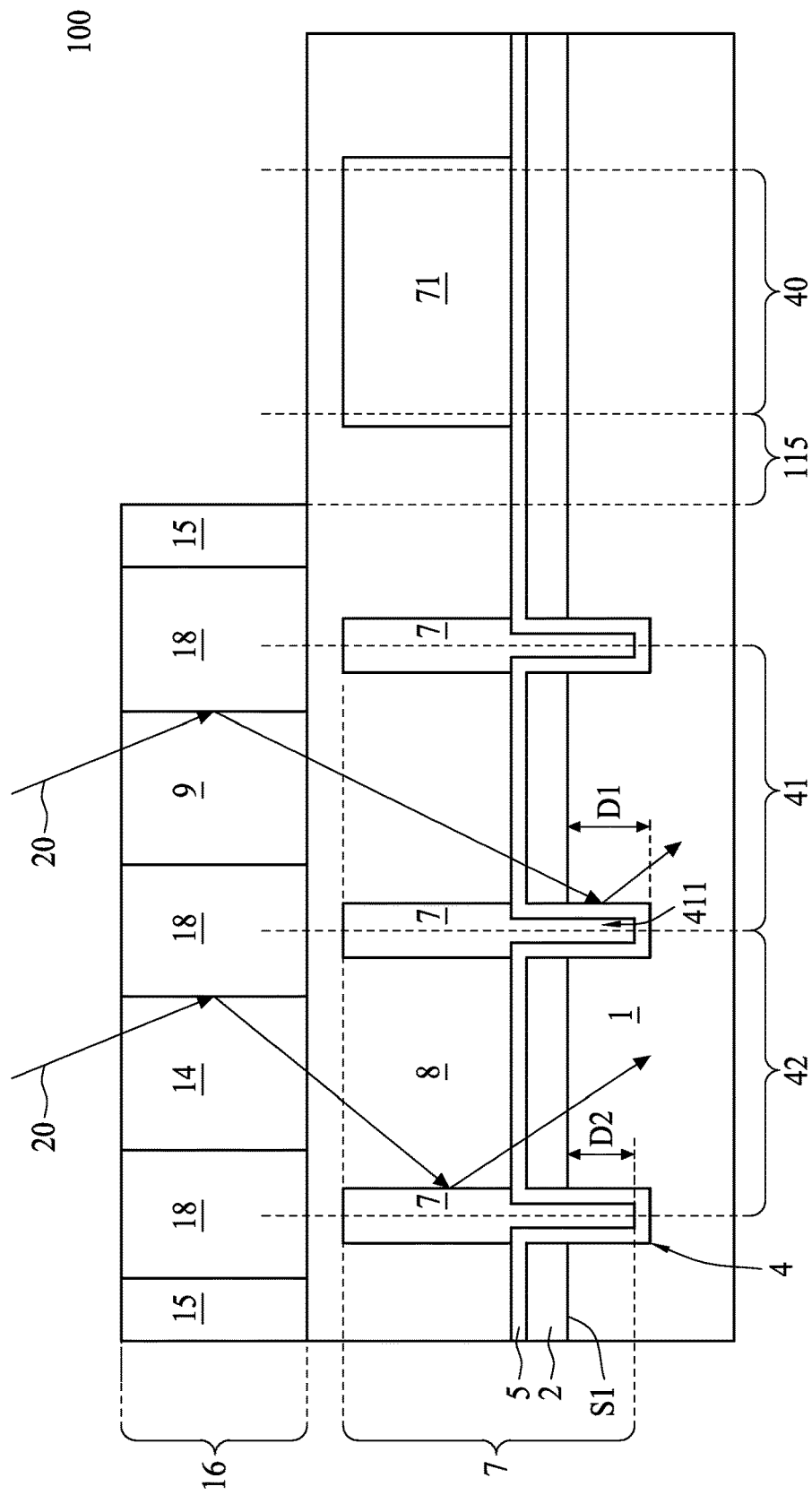
FIG. 17 is a cross-sectional view of an image sensor with some pixels, in accordance with some embodiments.

In FIG. 17, the barrier 18 is inserted between the color filters 9, 14, and 15 in a cross sectional point of view. A light 20 is passing through color filter 14 of a color filter array 16. Color filter 14 is in pixel 42. Color filter 14 is a red color filter. The light 20 traveling into color filter 14 is reflected by internal reflection at an interface between the color filter 14 and the barrier 18. The light 20 coming out of color filter 14 consist mostly of red light. The light 20 reaches the second dielectric layer 8 and is reflected from the conductive column 7 to stay within pixel 42.

Another light 20 is passing through the second dielectric layer 8, the first dielectric layer 5, and into the semiconductive substrate 1. The light 20 is reflected by internal reflection at an interface between the first dielectric layer 5 and the semiconductive substrate 1. A fourth refractive index of the first dielectric layer 5 is lower than a sixth refractive index of the semiconductive substrate 1.

Figure 18:
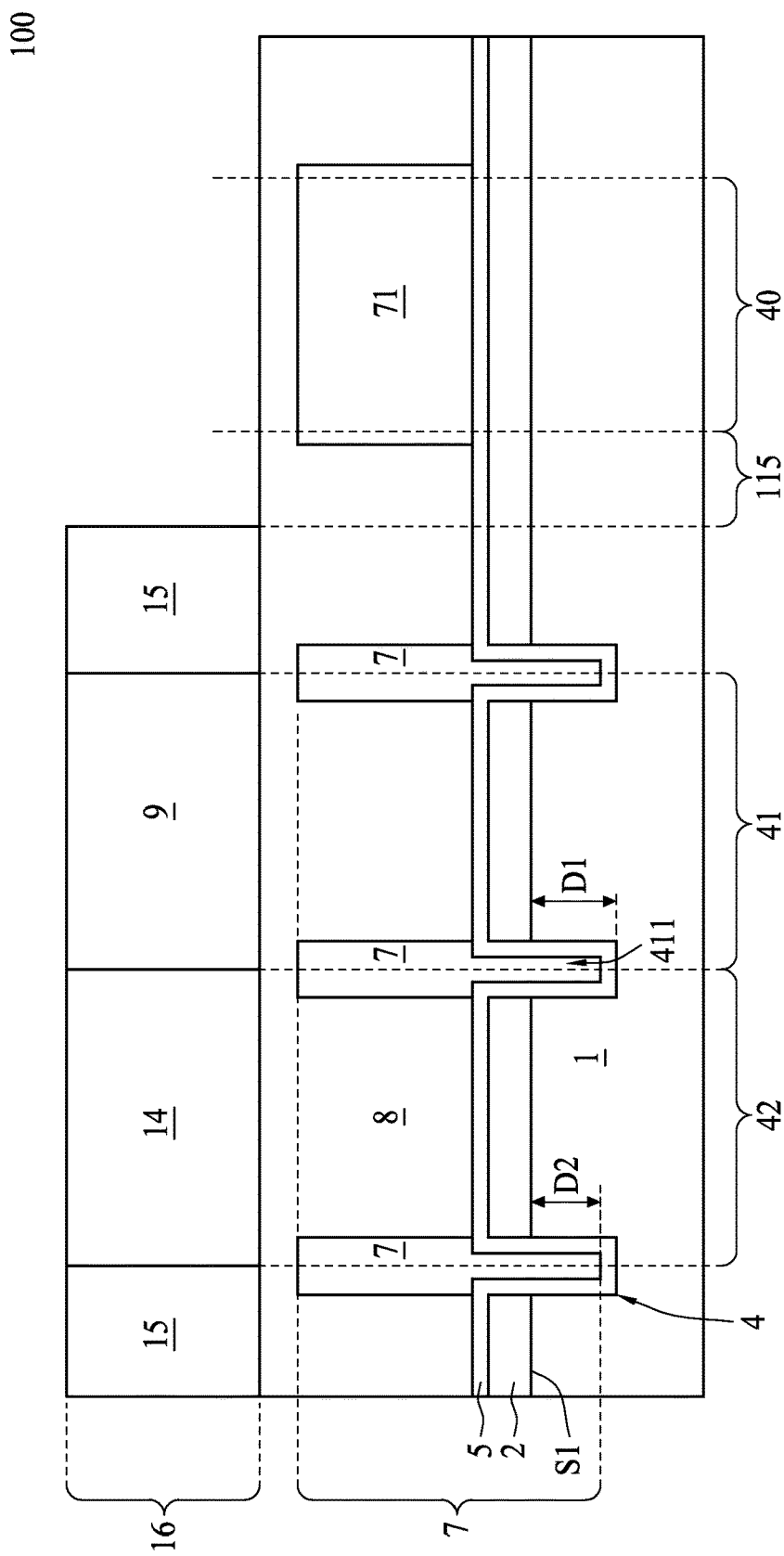
FIGS. 18 to 21 are cross sectional views of an operation in a method for manufacturing an image sensor, in accordance with some embodiments.

FIG. 18 to FIG. 21 illustrates a formation of the barrier 18. The formation of the barrier 18 is continuing from the operation of forming the color filter array 16 in FIG. 15. In FIG. 18, the image sensor 100 with color filter array 16 is illustrated. FIG. 18 is similar to FIG. 15.

Figure 19:
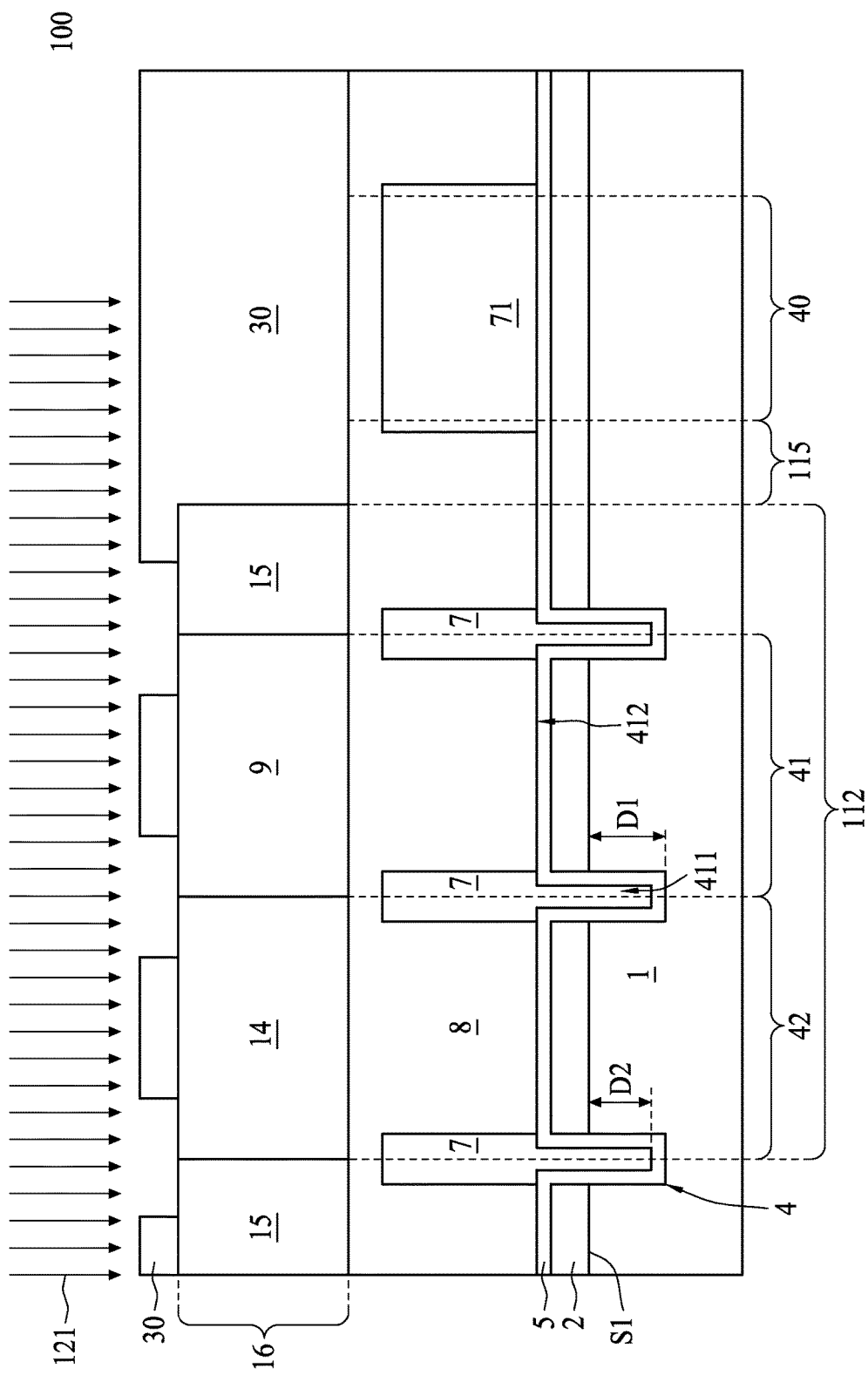

FIG. 19 illustrated a formation of a photoresist 30 formed on top of the color filter array 16 in the pixel region 112 and over the second dielectric layer 8 in the black level control (BLC) region 40. The photoresist 30 is patterned to include some openings to allow etching process 121 to recess some portions of the color filters 9, 14, and 15.

The layer of photoresist 30 is formed over color filter array 16 by a suitable process, such as spin-on coating, and patterned to form a photoresist feature by a proper photolithography patterning method. The photoresist feature can then be transferred by an etching process 121 to some underlying layers (i.e., color filter array 16). In some embodiments, the etching process 121 is a selective etching.

Figure 20:
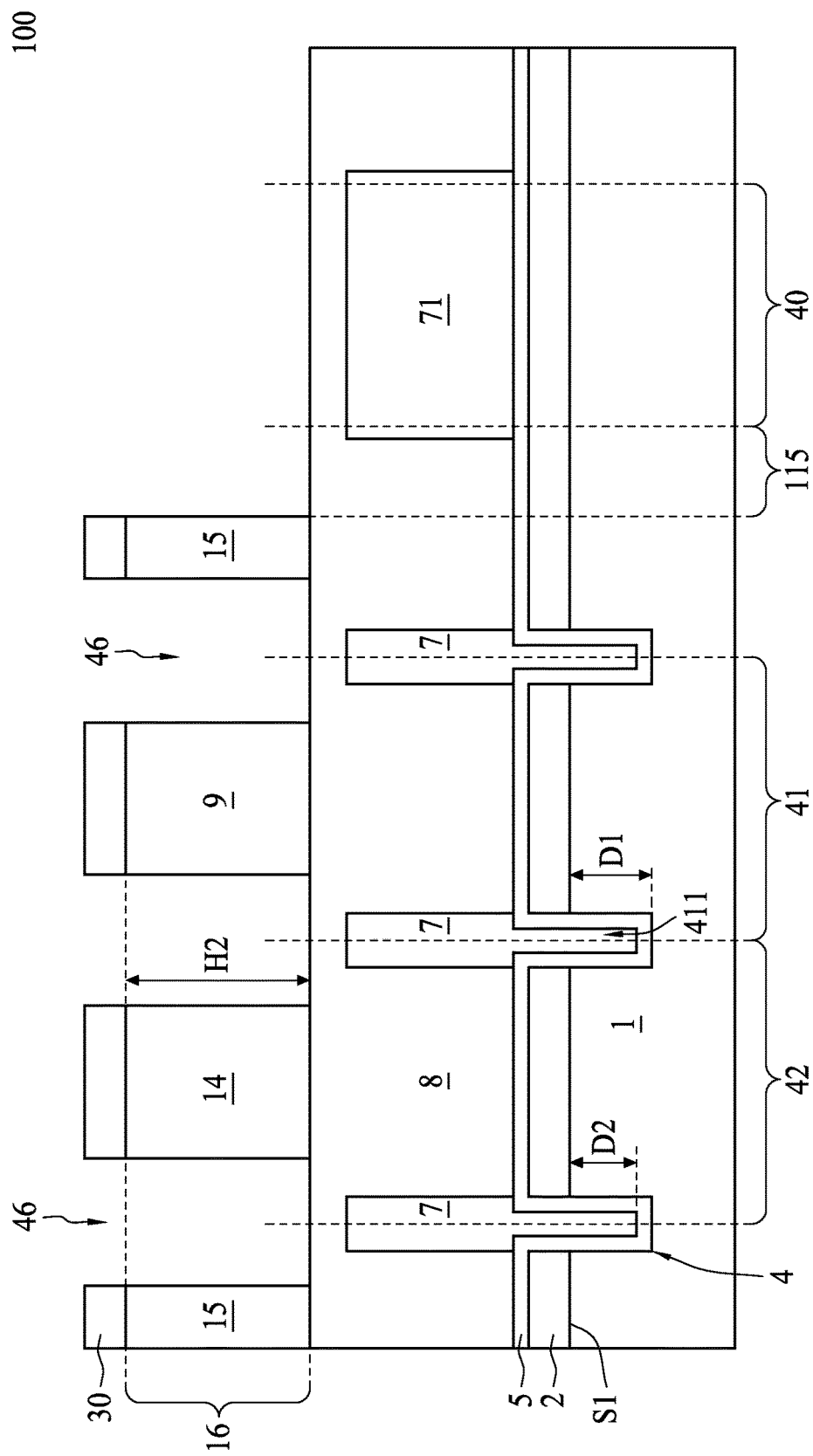

In FIG. 20, a recess 46 is formed between the color filters 9, 14, and 15. A portion of the color filter array 16 not covered by the photoresist 30 is removed by any suitable etching process. Some portions of the second dielectric layer 8 between the color filters 9, 14, and 15, and in the BLC region 40 are exposed. In some embodiments, the selective etching is used for removing the portion. The selective etching includes a slower etching rate for the second dielectric layer 8 underneath than for the color filter array 16. Different etchant can be used for etching different compositions of materials. In some other embodiments, the suitable etching process is a dry etching process. The dry etching process can be performed for a suitable duration to adjust the height H2 of recess 46. The photoresist 30 may be stripped after a suitable etching process.

Figure 21:
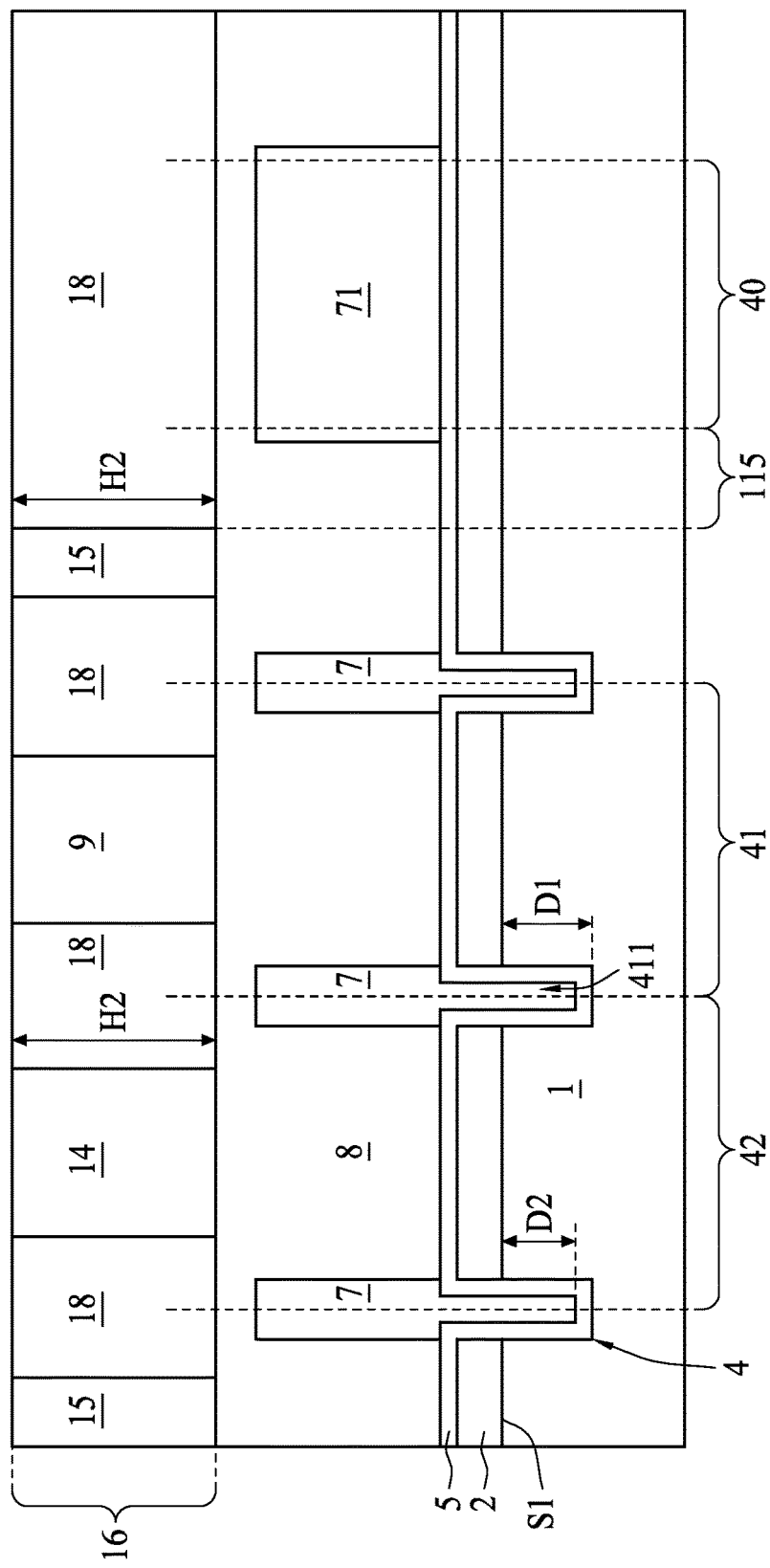

In FIG. 21, the barrier 18 is formed in between the color filters 9, 14, and 15, and in the BLC region 40. The barrier 18 can be blanket covering over the color filters 9, 14, and 15, and in the BLC region 40 by any suitable process such as a spin coating or a deposition process.

A planarization is performed to remove some excess portions (not shown) on top of the barrier 18 such that color filter array 16 is exposed. In some embodiments, a planarization, such as CMP, may also be used to remove the excess portions. The color filter array 16 includes a height H2 that is the same as a height H2 of the barrier 18.

Figure 22:
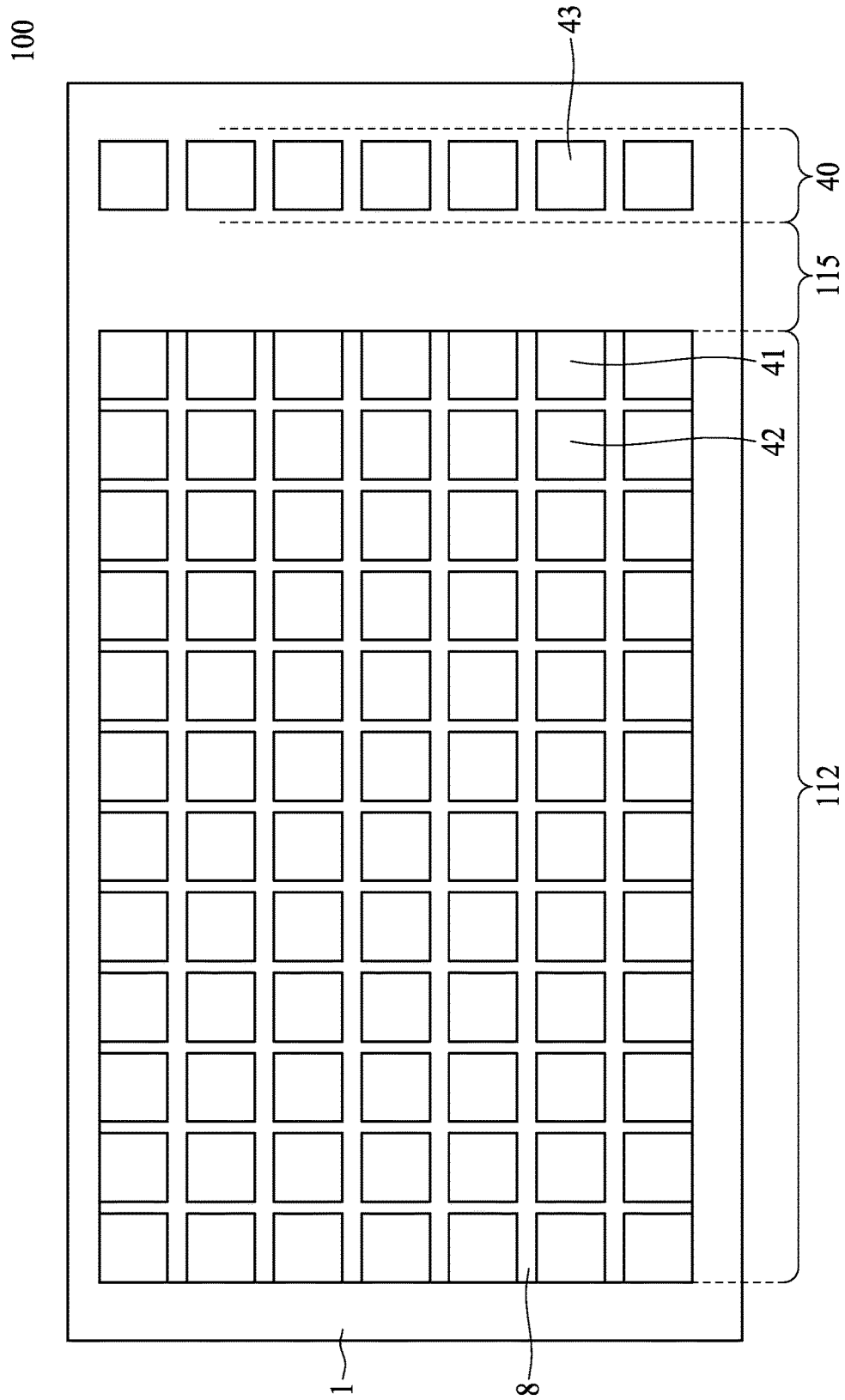
FIG. 22 is a plan view of an image sensor with some pixels, in accordance with some embodiments of the present disclosure.

In FIG. 22, in some embodiments, an image sensor 100 with the second dielectric layer 8 is illustrated. The image sensor 100 includes a semiconductive substrate 1, a plurality of pixels 42, 41, and 43. The second dielectric layer 8 is in between pixels 42 and 41 in the pixel region 112. The second dielectric layer 8 is also surrounding each pixel in the pixel region 112 and in the BLC region 40.

Figure 23:
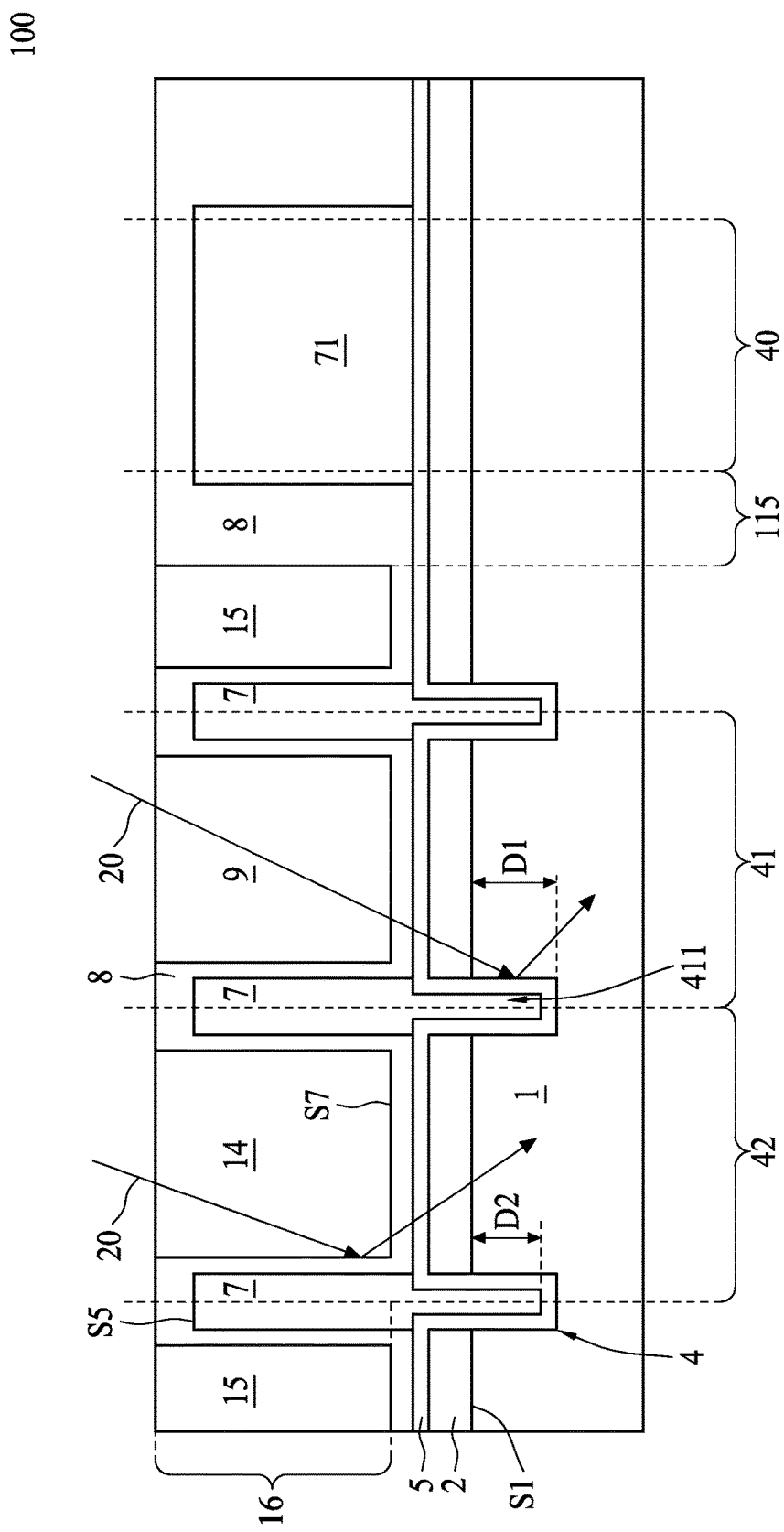
FIG. 23 is a cross-sectional view of an image sensor with some pixels, in accordance with some embodiments.

In FIG. 23, the second dielectric layer 8 is separating the color filters 9, 14, and 15 in a cross sectional point of view. A bottom surface S7 of the color filter 9, 14, or 15 is below the surface S5 of the conductive column 7. A light 20 is passing through color filter 14 of a color filter array 16. Light 20 traveling into color filter 14 is passing through the second dielectric layer 8 and reflected at an interface between the second dielectric layer 8 and the conductive column 7. The light 20 reflected from the conductive column 7 reaches the second dielectric layer 8 again at the bottom surface S7 and passing through the first dielectric layer 5.

The second dielectric layer 8 includes a third refractive index that is higher than a second refractive index of the color filter array 16. The third refractive index is higher than a refractive index of each color filter 9, 14, or 15.

Figure 24:
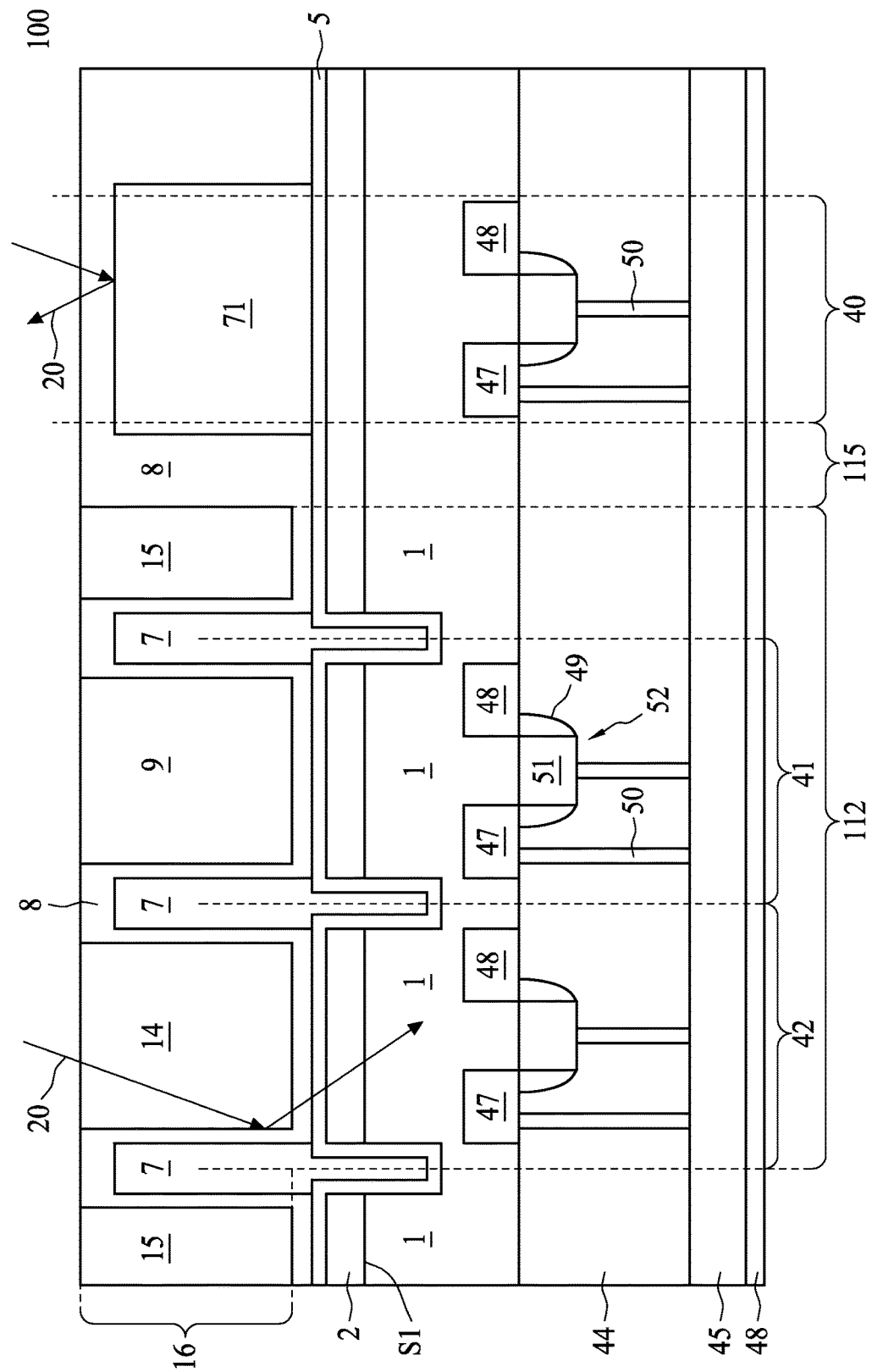
FIG. 24 is a cross-sectional view of an image sensor with some pixels, in accordance with some embodiments.

In FIG. 24, in some embodiments, an image sensor 100 includes a photosensitive element 48 coupled to a transistor 52, the photosensitive element 48 is in the semiconductive substrate 1. A distance traveling by the light 20 is approximately reduced in average by disposing the color filters 9, 14, 15 in between the conductive column 7.

FIG. 25 to FIG. 30 illustrates a formation of the color filter array 16 in between the conductive column 7. The formation of the color filter array 16 is continuing from the operation of forming the conductive column 7 in FIG. 9. In FIG. 25, the image sensor 100 with conductive column 7 is illustrated. FIG. 25 is similar to FIG. 9.

In FIG. 26, a second dielectric layer 8 is covering conformally over the conductive column 7. The second dielectric layer 8 is lining to a side of the upper portion 72 and overlying the first dielectric layer 5. The second dielectric layer 8 may be blanket deposited conformally over the conductive column 7 by any suitable deposition process such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), and low-pressure chemical vapor deposition (LPCVD) process. A thickness of the second dielectric layer 8 is controlled by duration of the deposition process.

The second dielectric layer 8 is in the buffer region 115 and extends over to the BLC region 40 and covering over a light shield 71 in the BLC region 40. In some embodiments, the second dielectric layer 8 is a thin film following a contour of the cavity 412 such that a cavity 414 is formed above the cavity 412 and between the conductive columns 7.

Figure 27:
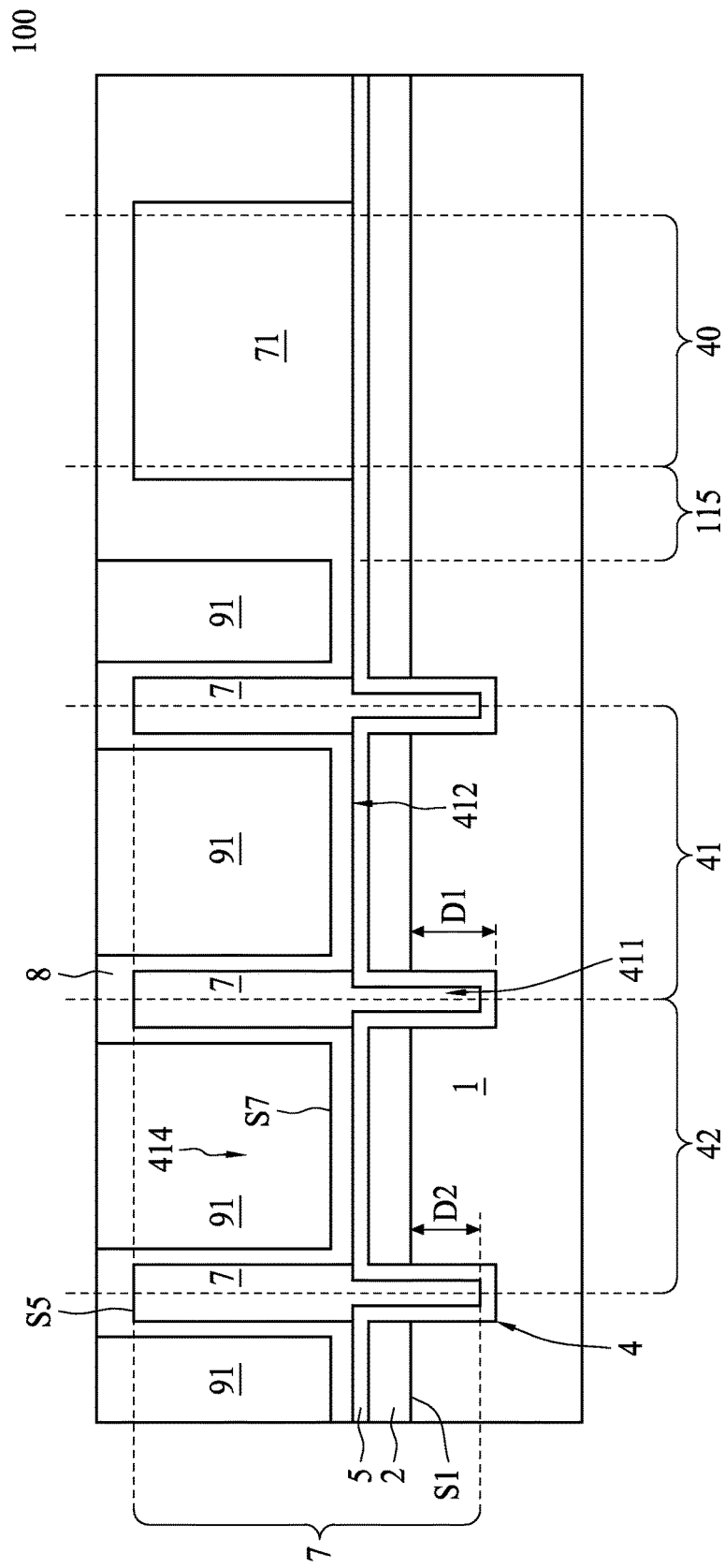

In FIG. 27, a color resist 91 is formed between the conductive columns 7 and filling inside the cavity 414. In some embodiments, some excess portions of the color resist 91 are deposited covering the conductive column 7. A planarization process removes the excess portions of the color resist 91 to expose a portion of the second dielectric layer 8 above the conductive column 7. The color resists 91 are separated by the conductive column 7 and disconnected from each other.

Figure 28:
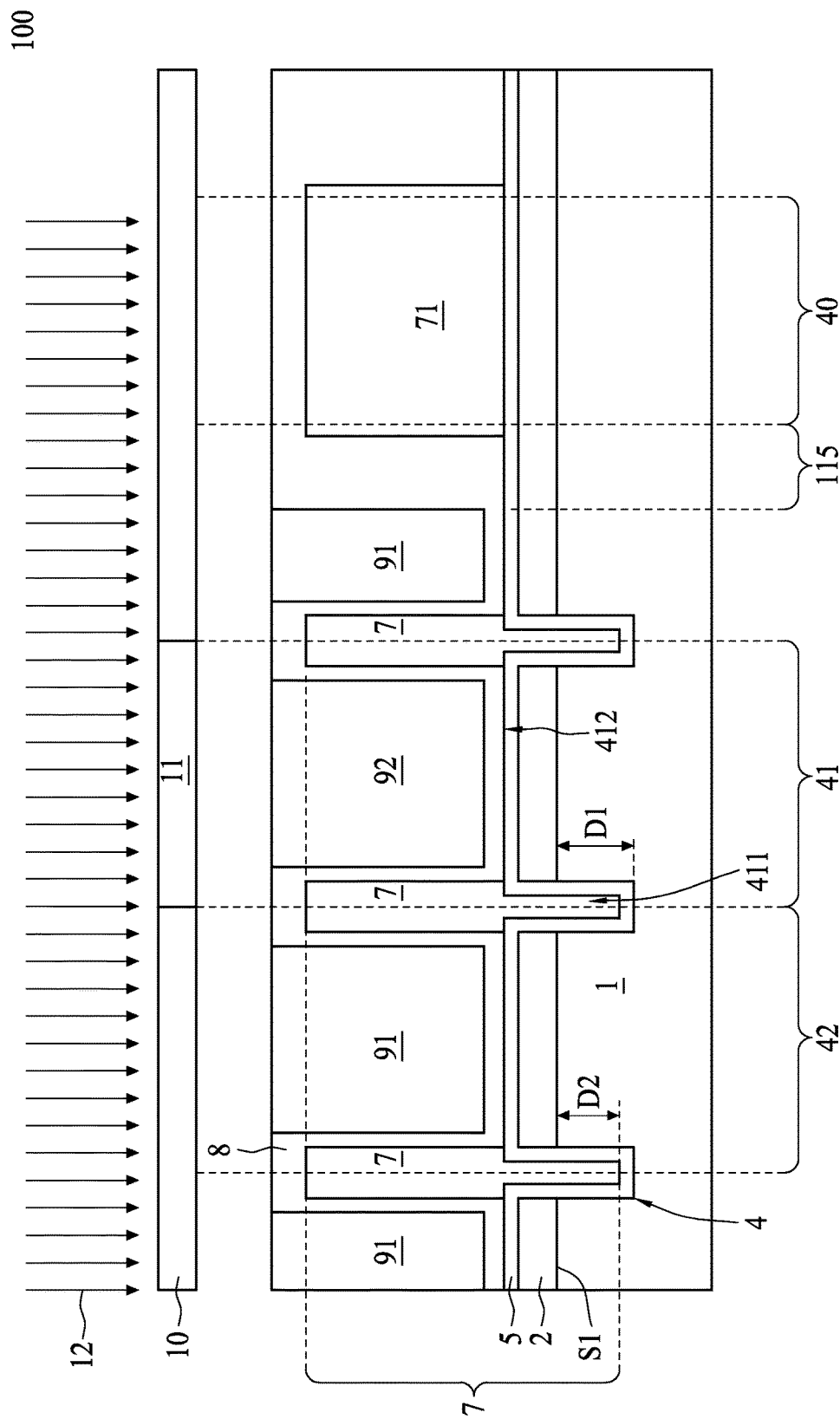

In FIG. 28, a photomask 10 is patterned to include a region 11. The region 11 forms a pattern over each pixel 41 or 42. The photomask 10 is placed over the color resist 91 to configure for allowing ultraviolet (UV) light 12 reaching to the color resist 91 under the region 11. The region 11 is over pixel 41. A portion of the color resist 91 under the region 11 is exposed to UV light 12 and cured. Some other portions of the color resist 91 in other pixels such as pixel 42 remain soluble and are washed away. The portion under the region 11 is insoluble and remains on top of the second dielectric layer 8 and between the conductive columns 7.

A photomask 10 is patterned to include a region 11. The region 11 forms a pattern on top of each pixel 41 or 42. The pattern corresponds to a pattern of the color filter array 16 in FIG. 23. The photomask 10 is placed over the color resist 91 to allow ultraviolet (UV) light 12 reaching to a portion 92 of the color resist 91 under the region 11. The color resist 91 is photosensitive. The portion 92 of the color resist 91 under the region 11 is exposed to UV light 12. To make the pattern insoluble, the portion 92 of the color resist 91 under the region 11 is UV cured by exposure through a photomask 10. The soluble portions of the color resist 91 is removed by a developing solution, the pattern is cured through baking. The portion 92 is hardened, insoluble and remained between the conductive columns 7.

Figure 29:
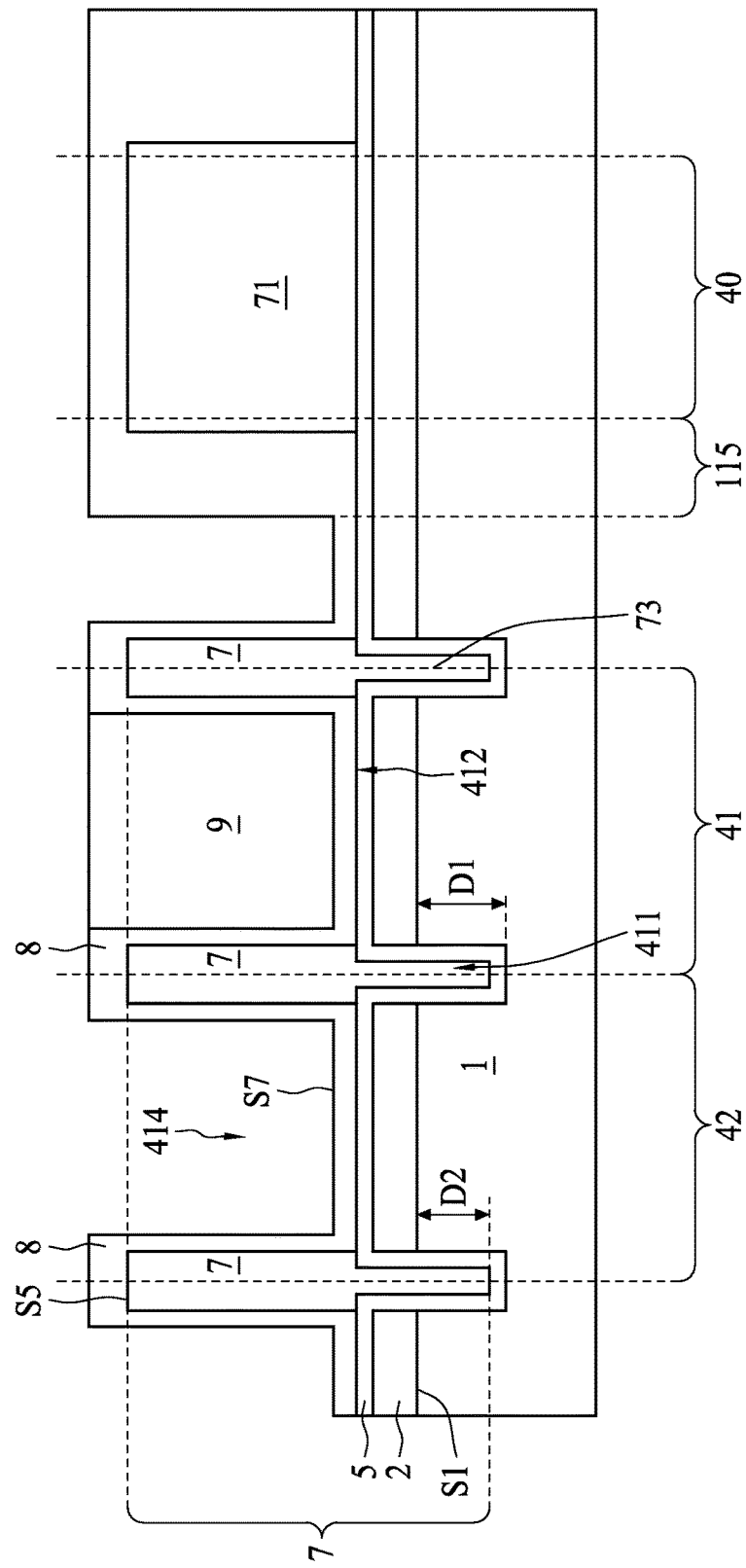

In FIG. 29, the portion remained is a color filter 9. The other portions are removed and the cavity 414 is formed in pixel 42 between the conductive columns 7. The color filter 9 is aligned within the pixel 41 and between the conductive columns 7. The operation of forming the color filter 9 is illustrated from FIG. 25 to FIG. 29.

Figure 30:
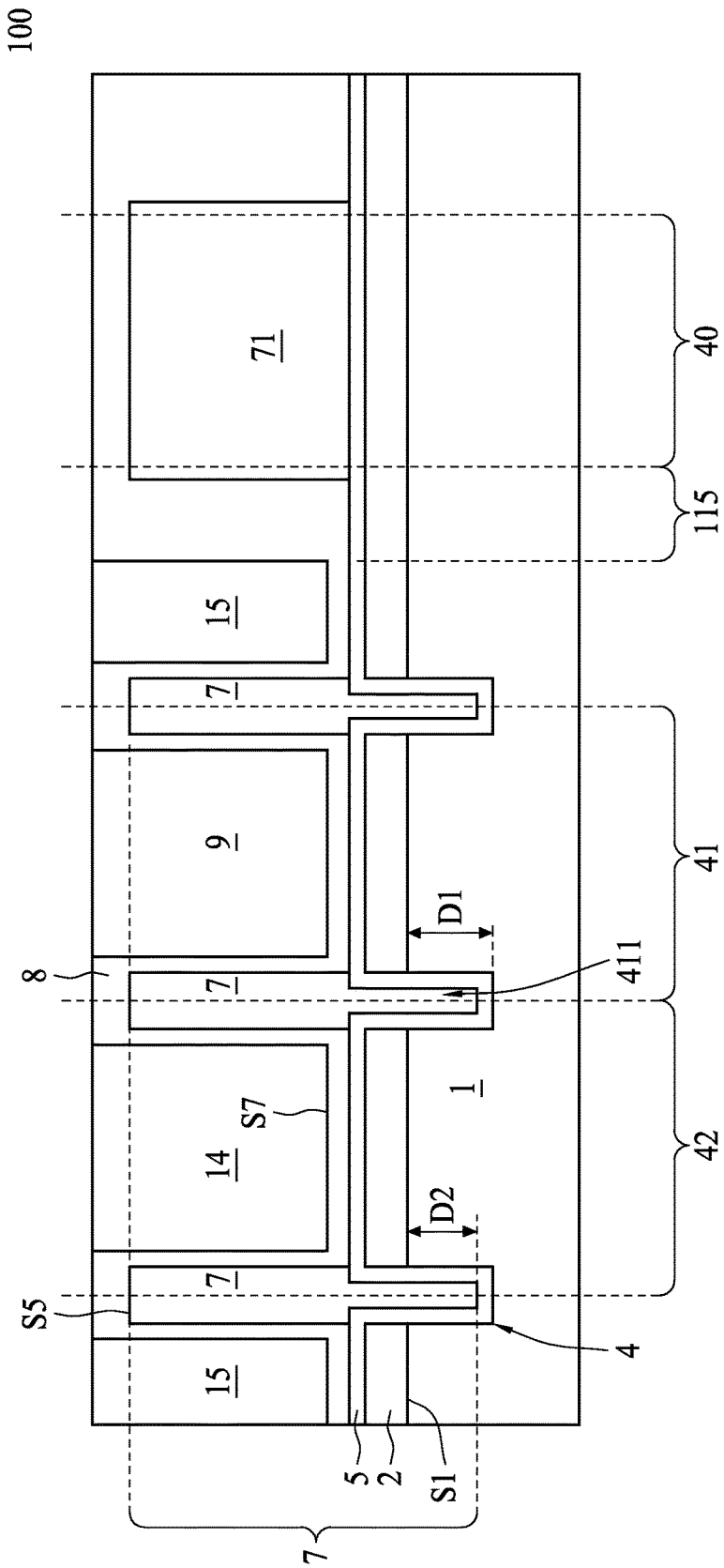

In FIG. 30, a color filter 14 and a color filter 15 are formed by a similar operation as the operation for forming the color filter 9, except that a different color resist is used and patterned to dispose in a different pixel. For example, the color filter 14 is disposed within pixel 42 next to the color filter 9. The color filter 15 is disposed next to the color filter 14. To form other color filters 15 and 14, a similar operation of photolithography is repeated as illustrated from FIG. 27 to FIG. 29.

Some embodiments of the present disclosure provide a method of manufacturing a back side illuminated (BSI) image sensor. The method includes receiving a semiconductive substrate; forming a photosensitive element at a front side of the semiconductive substrate; forming a transistor coupled to the photosensitive element; forming a recess at a back side of the semiconductive substrate; forming a first dielectric layer lining to a side portion of the recess and over the back side of the semiconductor substrate; covering a conductive material over the first dielectric layer and filling in the recess; forming a conductive column on top of the recess by patterning the conductive material; and forming a second dielectric layer covering the conductive column and the first dielectric layer.

Some embodiments of the present disclosure provide a method of manufacturing a back side illuminated (BSI) image sensor. The method includes receiving a semiconductive substrate; forming a photosensitive element at a front side of the semiconductive substrate; forming a transistor coupled to the photosensitive element and to an interconnection in a redistribution layer; forming a recess at a back side of the semiconductive substrate; forming a first dielectric layer conformally over the recess and over the back side of the semiconductor substrate; forming a conductive material filling in the recess and covering over the back side; forming a conductive column above the recess by patterning the conductive material such that a top portion of the first dielectric layer is exposed; and forming a second dielectric layer covering the conductive column and the first dielectric layer.

Some embodiments of the present disclosure provide a back side illuminated image (BSI) sensor. The back side illuminated image (BSI) sensor includes a semiconductive substrate; a recess at a back side of the semiconductive substrate; a first dielectric layer covered conformally over the recess and over the back side of the semiconductive substrate; a conductive column including an under portion in the recess and an upper portion above the recess; a second dielectric layer covered the conductive column and the first dielectric layer; a photosensitive element at a front side of the semiconductive substrate; and a transistor coupled to the photosensitive element and to an interconnection in a redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A back side illuminated image (BSI) sensor, comprising:
   a semiconductive substrate having a front side and a back side;
   a conductive column composed of conductive material penetrating into the semiconductive substrate from the back side towards the front side without passing through the front side;
   a first dielectric layer covering conformally over the back side of the semiconductive substrate and between the semiconductive substrate and the conductive column;
   wherein the conductive column comprises:
      an under portion in the semiconductive substrate; and
      an upper portion above the semiconductive substrate and protruding from a top surface of the first dielectric layer, the conductive material of the upper portion contacting the top surface of the first dielectric layer;
   wherein the first dielectric layer fully insulates sidewalls and a bottom of the under portion;
   a second dielectric layer covering the conductive column and the first dielectric layer; and
   a photosensitive element abutting the front side of the semiconductive substrate.

2. The image sensor of claim 1, further comprising a color filter disposed over the second dielectric layer, wherein the color filter comprises a first refractive index, and the second dielectric layer comprises a second refractive index higher than the first refractive index.

3. The image sensor of claim 1, further comprising a buffer layer between the back side of the semiconductive substrate and the first dielectric layer.

4. The image sensor of claim 2, further comprising a barrier abutting the color filter and being above the second dielectric layer, wherein the barrier comprises a third refractive index lower than the first refractive index.

5. The image sensor of claim 1, further comprising a color filter disposed beside the conductive column.

6. The image sensor of claim 3, wherein the buffer layer comprises a first refractive index and the first dielectric layer comprises a second refractive index lower than the first refractive index.

7. The image sensor of claim 3, wherein the buffer layer comprises a first refractive index and the semiconductive substrate comprises a second refractive index higher than the first refractive index.

8. The image sensor of claim 1, wherein the first dielectric layer comprises a first refractive index and the second dielectric layer comprises a second refractive index lower than the first refractive index.

9. The image sensor of claim 1, wherein the first dielectric layer comprises a first refractive index and the semiconductive substrate comprises a second refractive index higher than the first refractive index.

10. A back side illuminated image (BSI) sensor, comprising:
a semiconductive substrate having a front side and a back side;
a conductive column composed of conductive material penetrating into the semiconductive substrate from the back side towards the front side without passing through the front side;
a first dielectric layer covering conformally over the back side of the semiconductive substrate and between the semiconductive substrate and the conductive column;
wherein the conductive column comprises:
an under portion in the semiconductive substrate; and
an upper portion above the semiconductive substrate and protruding from a top surface of the first dielectric layer, the conductive material of the upper portion contacting the top surface of the first dielectric layer;
wherein the first dielectric layer fully insulates sidewalls and a bottom of the under portion;
a second dielectric layer covering the conductive column and the first dielectric layer; and
a doped region abutting the front side within the semiconductive substrate for converting light to charges.

11. The image sensor of claim 10, further comprising a color filter disposed over the second dielectric layer, wherein the color filter comprises a first refractive index, and the second dielectric layer comprises a second refractive index higher than the first refractive index.

12. The image sensor of claim 11, further comprising a barrier abutting the color filter and being above the second dielectric layer, wherein the barrier comprises a third refractive index lower than the first refractive index.

13. The image sensor of claim 10, further comprising a buffer layer between the back side of the semiconductive substrate and the first dielectric layer.

14. The image sensor of claim 13, wherein the buffer layer comprises a first refractive index and the first dielectric layer comprises a second refractive index lower than the first refractive index.

15. The image sensor of claim 13, wherein the buffer layer comprises a first refractive index and the semiconductive substrate comprises a second refractive index higher than the first refractive index.

16. The image sensor of claim 10, wherein the first dielectric layer comprises a first refractive index and the second dielectric layer comprises a second refractive index lower than the first refractive index.

17. The image sensor of claim 10, wherein the first dielectric layer comprises a first refractive index and the semiconductive substrate comprises a second refractive index higher than the first refractive index.

18. A back side illuminated image (BSI) sensor, comprising:
a semiconductive substrate having a front side and a back side;
a conductive column composed of conductive material penetrating into the semiconductive substrate from the back side towards the front side without passing through the front side;
a first dielectric layer covering conformally over the back side of the semiconductive substrate and between the semiconductive substrate and the conductive column;
wherein the conductive column comprises:
an under portion in the semiconductive substrate; and
an upper portion above the semiconductive substrate and protruding from a top surface of the first dielectric layer, the conductive material of the upper portion contacting the top surface of the first dielectric layer;
wherein the first dielectric layer fully insulates sidewalls and a bottom of the under portion;
a second dielectric layer covering the conductive column and the first dielectric layer; and
a transistor abutting the front side.

19. The image sensor of claim 18, further comprising a buffer layer between the back side of the semiconductive substrate and the first dielectric layer.

20. The image sensor of claim 19, wherein the buffer layer comprises a first refractive index and the first dielectric layer comprises a second refractive index lower than the first refractive index.

* * * * *